(12) United States Patent
Takata et al.

(10) Patent No.: US 8,692,252 B2
(45) Date of Patent: Apr. 8, 2014

(54) THIN-FILM TRANSISTOR, METHOD OF PRODUCING THE SAME, AND DEVICES PROVIDED WITH THE SAME

(75) Inventors: Masahiro Takata, Kanagawa-ken (JP); Masashi Ono, Kanagawa-ken (JP); Masayuki Suzuki, Kanagawa-ken (JP); Atsushi Tanaka, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 392 days.

(21) Appl. No.: 12/964,375

(22) Filed: Dec. 9, 2010

(65) Prior Publication Data

US 2011/0140100 A1 Jun. 16, 2011

(30) Foreign Application Priority Data

Dec. 10, 2009 (JP) ................. 2009-280217

(51) Int. Cl.
*H01L 29/04* (2006.01)
*H01L 29/10* (2006.01)
*H01L 31/036* (2006.01)

(52) U.S. Cl.
USPC ......... 257/59; 257/43; 257/E21.411; 438/151

(58) Field of Classification Search
USPC ....... 257/43, 59, E21.411; 438/142, 149, 151
See application file for complete search history.

(56) References Cited

U.S. PATENT DOCUMENTS

| | | | |
|---|---|---|---|
| 2008/0038882 A1* | 2/2008 | Takechi et al. ................ | 438/151 |
| 2009/0134336 A1 | 5/2009 | Takahashi | |
| 2009/0180045 A1 | 7/2009 | Yoon et al. | |
| 2009/0294765 A1 | 12/2009 | Tanaka et al. | |
| 2010/0140614 A1* | 6/2010 | Uchiyama et al. ............. | 257/43 |

FOREIGN PATENT DOCUMENTS

| | | |
|---|---|---|
| JP | 2006-165529 A | 6/2006 |
| JP | 2009-130209 A | 6/2009 |
| JP | 2009-170905 A | 7/2009 |
| JP | 2009-224356 A | 10/2009 |
| JP | 2009-290113 A | 12/2009 |

OTHER PUBLICATIONS

Nomura et al., Thin-Film Transistor Fabricated in Single-Crystalline Transparent Oxide Semiconductor, Science, vol. 300, May 23, 2003, pp. 1269-1272.*
Nomura, et al., "Room-temperature fabrication of transparent flexible thin-film transistors using amorphous oxide semiconductors", Nature, vol. 432, Nov. 25, 2004, pp. 488-491.*
Koike et al., "Characteristics of a Zn0.7MG0.3O/ZNO Heterostructure Field-Effect Transistor Grown on Sapphire Substrate by Molecular-Beam Epitaxy", Applied. Physics Letters, vol. 87, pp. 112106-1-112106-3, 2005.
Japanese Office Action issued on Jan. 7, 2014 in corresponding Application No. 2009-280217.

* cited by examiner

*Primary Examiner* — Sonya D McCall Shepard
(74) *Attorney, Agent, or Firm* — Birch, Stewart, Kolasch & Birch, LLP

(57) ABSTRACT

A thin-film transistor including an oxide semiconductor layer is disclosed. The oxide semiconductor layer includes a first area, a second area and a third area forming a well-type potential in the film-thickness direction. The first area forms a well of the well-type potential and has a first electron affinity. The second area is disposed nearer to the gate electrode than the first area and has a second electron affinity smaller than the first electron affinity. The third area is disposed farther from the gate electrode than the first area and has a third electron affinity smaller than the first electron affinity. At least an oxygen concentration at the third area is lower than an oxygen concentration at the first area.

26 Claims, 16 Drawing Sheets

FIG.9
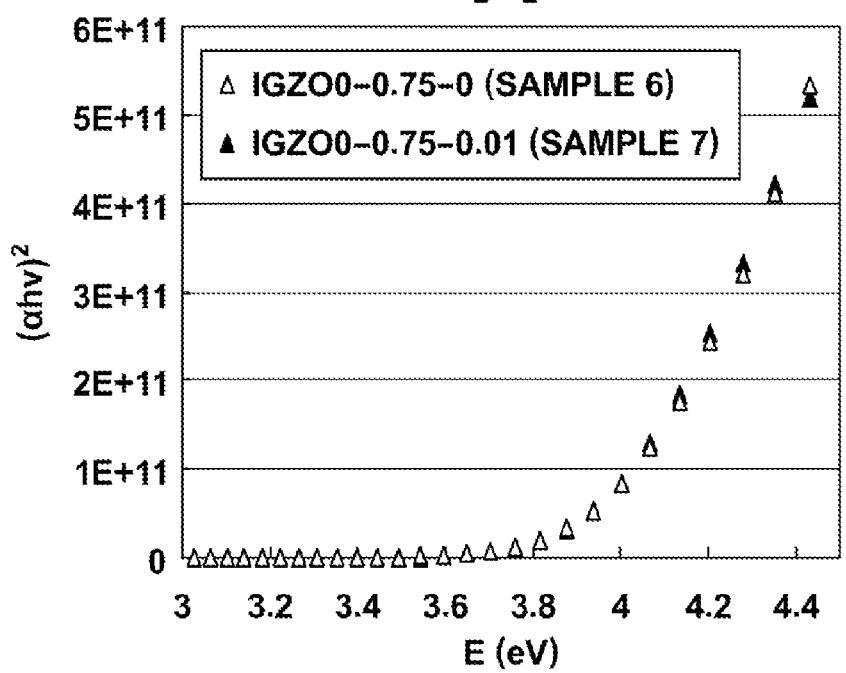
A
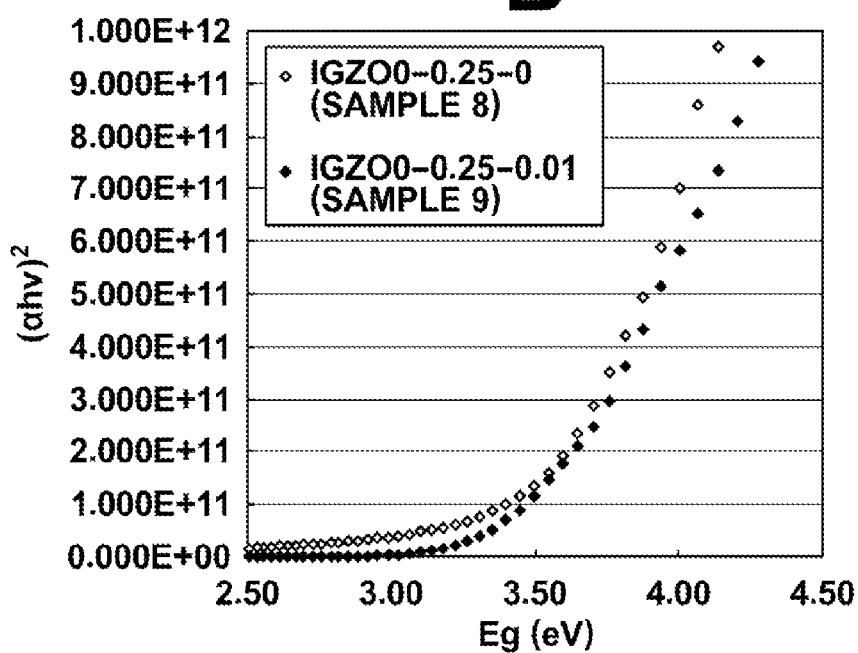
B

FIG. 11
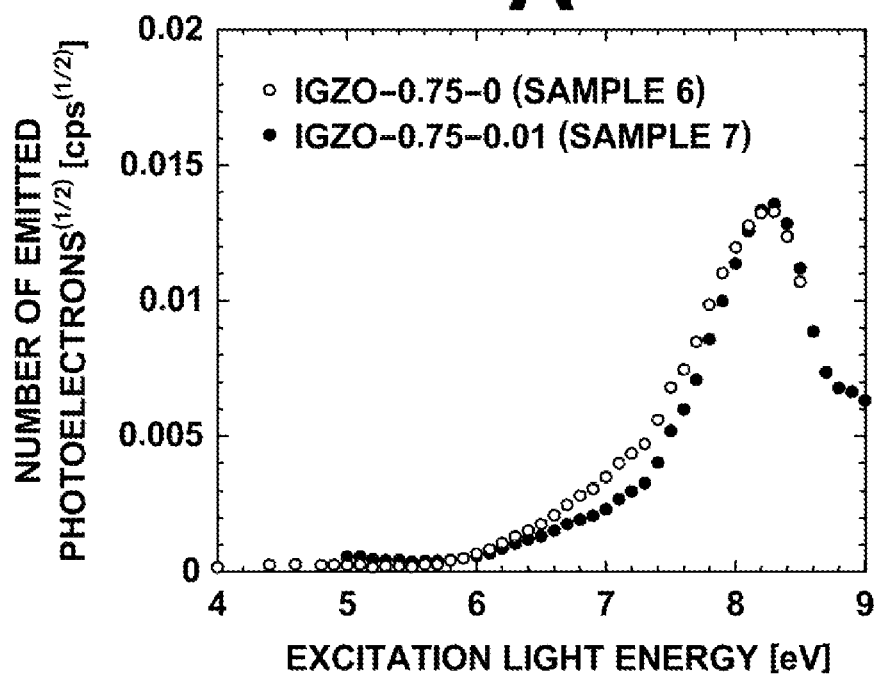
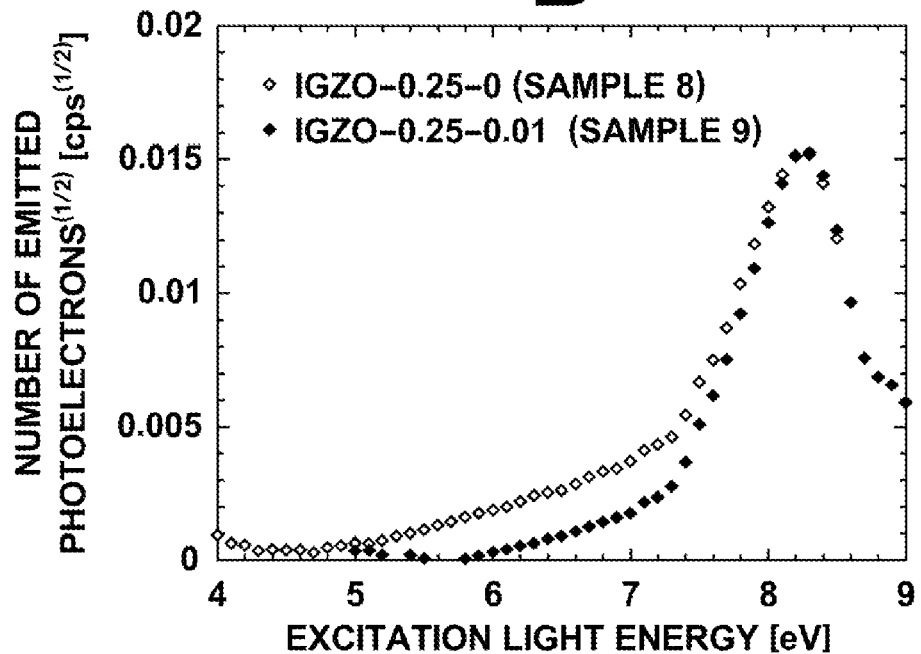

FIG.15
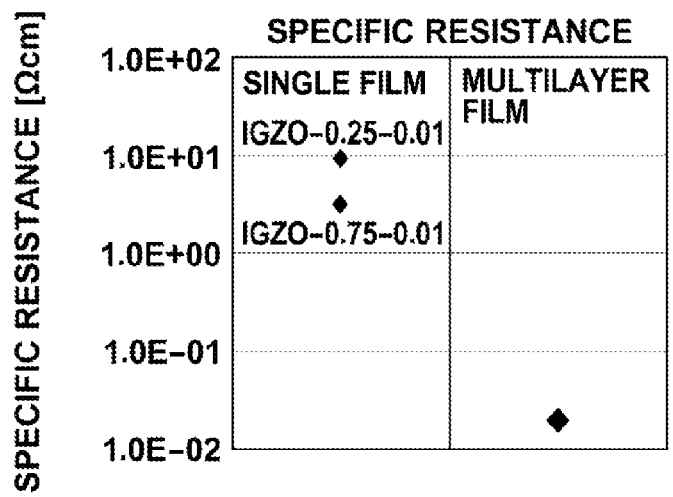
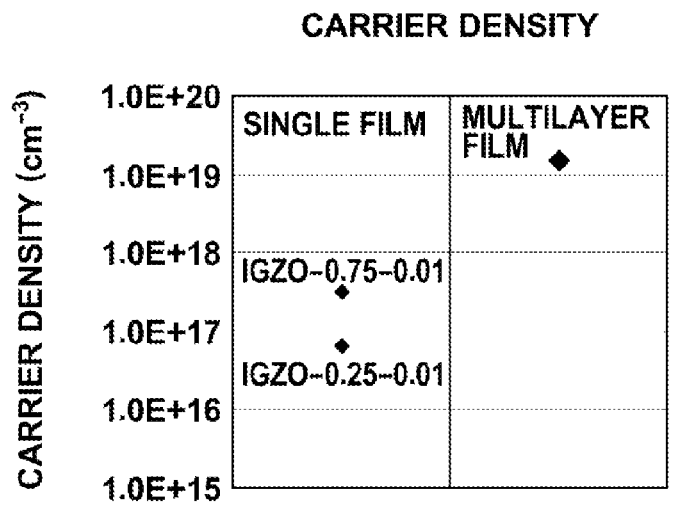
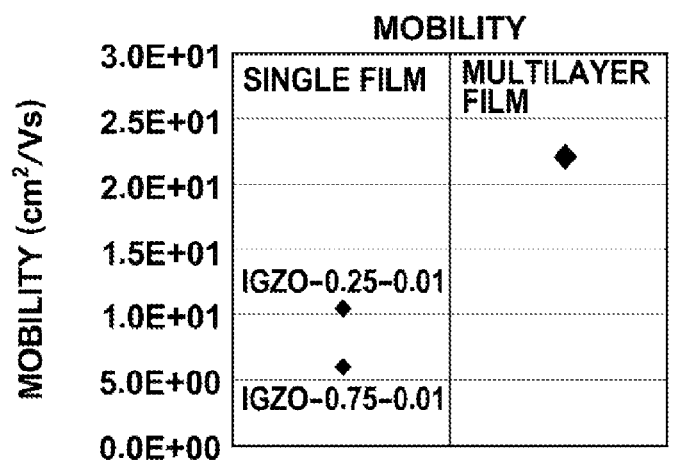

THIN-FILM TRANSISTOR, METHOD OF PRODUCING THE SAME, AND DEVICES PROVIDED WITH THE SAME

BACKGROUND OF THE INVENTION

1. Field of the Invention

The present invention relates to a thin-film transistor provided with an oxide semiconductor thin film and a method of producing the thin-film transistor. The present invention further relates to devices, such as a display device, an imaging sensor and an X-ray digital imaging device, using the thin-film transistor.

2. Description of the Related Art

In recent years, thin-film transistors using an In—Ga—Zn—O (IGZO) oxide semiconductor thin film as a channel layer are actively developed. The IGZO oxide semiconductor thin film can be formed by a low temperature film formation process, exhibits higher mobility than amorphous silicon, and is transparent to visible light. Therefore, the IGZO oxide semiconductor thin film allows formation of a flexible transparent thin-film transistor on a flexible substrate, such as a plastic plate or a film.

Table 1 shows comparison of characteristics, such as mobility and process temperature, of various transistors.

TABLE 1

|  | LTPS Low-Temperature Poly Silicon | a-Si:H | μC-Si:H | Organic TFT | Oxide TFT |
|---|---|---|---|---|---|
| Mobility | 100 | <1 | 2-3 | <1-5 | 3-50 |
| Stability $\Delta V_{TH}$ | <1 | 100 | 1-2 | 30 | 1-2 |
| Uniformity | Acceptable | Excellent | Good | Acceptable | Good |
| Film Formation Temperature | 450 | 300 | 300 | RT-100 | RT-350 |

Conventional poly silicon thin-film transistors can provide a mobility of about 100 $cm^2/Vs$. However, the poly silicon thin-film transistors require a very high process temperature of 450° C. or more, and thus only can be formed on substrates with high heat resistance. Therefore, the poly silicon thin-film transistors are not suitable for providing large-area flexible thin-film transistors at low costs. Amorphous silicon thin-film transistors can be formed at a relatively low temperature around 300° C. and allow a wider selection of substrates than those usable with poly silicon. However, the amorphous silicon thin-film transistors can provide a mobility of around 1 $cm^2/Vs$ at best, and thus are not suitable for high-definition display applications. In view of low temperature film formation, organic thin-film transistors can be formed at a temperature of 100° C. or less, and are expected to be applied to flexible displays, etc., using a substrate with low heat resistance, such as a plastic film. However, the organic thin-film transistors have only achieved the same level of mobility as that of the amorphous silicon.

That is, a thin-film transistor that can be formed at a relatively low temperature around 300° C. or less and has a high mobility of around 100 $cm^2/Vs$ has not yet been accomplished.

As a method to improve the carrier mobility of a transistor, a HEMT (High Electron Mobility Transistor) structure has been proposed, in which different types of semiconductors having different electron affinities are joined and a quantum well is used as the channel of the transistor. With respect to the oxide semiconductor thin-film transistors, it has been reported that a device having the HEMT structure formed by sandwiching ZnO with ZnMgO provided a high mobility of 140 $cm^2/Vs$ (K. Koike et al., "Characteristics of a $Zn_{0.7}Mg_{0.3}O/ZnO$ heterostructure field-effect transistor grown on sapphire substrate by molecular-beam epitaxy", Applied Physics Letters, Vol. 87, 112106, pp. 112106-1-112106-3, 2005 which is hereinafter referred to as Non-Patent Document 1).

Further, as a thin-film transistor using the IGZO oxide semiconductor thin film, a thin-film transistor with an active layer which has a multilayer structure formed by IGZO films having different physical quantities has been proposed. Japanese Unexamined Patent Publication No. 2006-165529 (which is hereinafter referred to as Patent Document 1) discloses a field effect transistor with an active layer containing an amorphous oxide, where the active layer has a double-layer structure including a first area and a second area nearer to a gate insulating film than the first area, and an oxygen concentration at the second area is higher than an oxygen concentration at the first area. Patent Document 1 teaches that, with this structure, a higher electric resistance is provided at the active layer near the gate insulating film, and the channel is formed inside the amorphous oxide, thereby allowing reduction of leakage current.

However, Non-Patent Document 1 does not consider controlling the electron affinity by controlling the level of the oxygen concentration, as disclosed in the present invention, and all the HEMT structures disclosed in Non-Patent Document 1 are formed through single-crystal thin film epitaxial growth, such as MBE (Molecular Beam Epitaxy). In order to employ this type of growth method, it is necessary to minimize the lattice mismatch between the film and the substrate to a very low level and keep the substrate temperature during the film formation to a high temperature over 700° C. Therefore, this type of growth method allows very limited selection of substrate materials.

Further, although it is stated in Patent Document 1 that the invention of Patent Document 1 allows reduction of leakage current, it fails to provide a sufficient carrier density, resulting in insufficient mobility.

SUMMARY OF THE INVENTION

In view of the above-described circumstances, the present invention is directed to providing a thin-film transistor including an oxide semiconductor, in particular an IGZO oxide semiconductor, which can be produced at a low temperature (300° C. or less) and has high electron mobility at a channel layer, and a method of producing the thin-film transistor. The present invention is also directed to providing devices including the thin-film transistor which has high electron mobility at the channel layer.

An aspect of the thin-film transistor of the invention is a thin-film transistor including an oxide semiconductor layer, a source electrode, a drain electrode, a gate insulating film and a gate electrode formed on a substrate, wherein the oxide semiconductor layer includes a first area, a second area and a third area forming a well-type potential in the film-thickness direction, the first area forming a well of the well-type potential and having a first electron affinity, the second area being disposed nearer to the gate electrode than the first area and having a second electron affinity smaller than the first electron affinity, and the third area being disposed farther from the gate electrode than the first area and having a third electron affinity smaller than the first electron affinity, and wherein at least an oxygen concentration at the third area is lower than an oxygen concentration at the first area.

FIG. 1 shows parameters of the electron structure of a semiconductor. Electron affinity (X) refers to the energy required for adding one electron, and in the case of a semiconductor, it refers to an energy gap between the lower end of a conductor ($E_c$) and a vacuum level ($E_{Vac}$).

As shown in FIG. 1, the electron affinity can be calculated from a difference between an ionization potential (I) and a bandgap energy (Eg). The ionization potential (I) can be found by photoelectron spectroscopy measurement, and the bandgap energy (Eg) can be found by transmission spectrum measurement and reflectance spectrum measurement.

That is, as shown by the potential structure shown at "A" in FIG. 2, the oxide semiconductor layer of the thin-film transistor of the invention includes, in the film-thickness direction from the gate electrode side (the gate insulating film side shown at "A" in FIG. 2), a second area $A_2$, a first area $A_1$ and a third area $A_3$, where an electron affinity $X_1$ at the first area $A_1$ is larger than electron affinities $X_2$ and $X_3$ at the second area $A_2$ and the third area $A_3$ and forms the well-type potential, and at least the difference between the electron affinities at the first area $A_1$ and the third area $A_3$ is provided by a difference between oxygen concentrations at the first area $A_1$ and the third area $A_3$.

The "area" herein refers to a three-dimensional area (part) in the film-thickness direction. It should be noted that the first to third areas of the oxide semiconductor layer are formed of the same type of materials. The "same type" herein means that the films are formed by the same elemental species with different cationic composition ratios and oxygen concentrations, or with different elements doped at a part of the constituent elements. For example, IGZO films having different values of Ga/(In+Ga) are of the same type, and an IGZO film with Mg doped at a part thereof and an IGZO film with Zn doped at a part thereof are of the same type.

The potential difference (difference of the electron affinity) among the first to third areas of the oxide semiconductor layer can be provided by varying the oxygen concentrations and/or varying the cationic (positive ionic) composition ratios at the first to third areas.

In the thin-film transistor of the invention, the oxygen concentration at the second area may be lower than the oxygen concentration at the first area.

In the thin-film transistor of the invention, the first area and the second area may have different cationic composition ratios, and the first area and the third area may have different cationic composition ratios.

In the thin-film transistor of the invention, the second area and the third area may have bandgaps larger than a bandgap at the first area. That is, as shown by the potential structure shown at "B" in FIG. 2, a bandgap $Eg_2$ at the second area $A_2$ and a bandgap $Eg_3$ at the third area $A_3$ may be larger than a bandgap $Eg_1$ at the first area $A_1$.

In the thin-film transistor of the invention, the oxide semiconductor layer may be an amorphous film.

Whether or not the oxide semiconductor layer is amorphous can be checked by X-ray diffraction measurement. That is, if no clear peak indicating any crystal structure is detected in the X-ray diffraction measurement, the oxide semiconductor layer is determined to be amorphous.

In the thin-film transistor of the invention, each area of the oxide semiconductor layer may contain at least one element selected from the group consisting of Al, Sc, Ti, Mn, Fe, Ga, Y, In, Sn, Ho, Er, Tm, Yb and Lu, and at least one element selected from the group consisting of Mg, Ca, Ni, Zn, Sr and Ba.

Alternatively, in the thin-film transistor of the invention, each area of the oxide semiconductor layer may contain at least one of In and Ga.

In the thin-film transistor of the invention, in particular, each area of the oxide semiconductor layer may be made of $a(In_2O_3) \cdot b(Ga_2O_3) \cdot c(ZnO)$, where $a \geq 0$, $b \geq 0$, $c \geq 0$, $a+b \neq 0$, $b+c \neq 0$ and $c+a \neq 0$.

In the oxide semiconductor layer, a value of b/(a+b) at the first area may be smaller than values of b/(a+b) at the second area and the third area.

In this case, the value of b/(a+b) at the first area of the oxide semiconductor layer may be not more than 0.95.

Further, the values of b/(a+b) at the second area and the third area may be not less than 0.5.

In particular, the value of b/(a+b) at the first area of the oxide semiconductor layer may be 0.25, and the values of b/(a+b) at the second area and the third area may be 0.75.

In the thin-film transistor of the invention, the substrate may be flexible.

Examples of the flexible substrate may include: saturated polyester/polyethylene terephthalate (PET) resin substrates; polyethylene naphthalate (PEN) resin substrates; cross-linked diester fumarate resin substrates; polycarbonate (PC) resin substrates; polyether sulfone (PES) resin substrates; polysulfone (PSF, PSU) resin substrates; polyallylate (PAR) resin substrates; cyclic polyolefin (COP, COC) resin substrates; cellulose resin substrates; polyimide (PI) resin substrates; polyamideimide (PAI) resin substrates; maleimide-olefin resin substrates; polyamide (PA) resin substrates; acrylic resin substrates; fluorine resin substrates; epoxy resin substrates; silicone resin film substrates; polybenzoxazole resin substrates; substrates made of episulfide compounds; liquid crystal polymer (LCP) substrates; cyanate resin substrates; aromatic ether resin substrates; substrates made of composite plastic materials containing silicon oxide particles; substrates made of composite plastic materials containing nanoparticles, such as metal nanoparticles, inorganic oxide nanoparticles, inorganic nitride nanoparticles; substrates made of composite plastic materials containing metal or inorganic nanofiber and microfiber; substrates made of composite plastic materials containing carbon fiber or carbon nanotube; substrates made of composite plastic materials containing glass flake, glass fiber or glass beads; substrates made of composite plastic materials containing a clay mineral or particles having a mica-derived crystal structure; substrates formed by laminated plastic materials having at least one bonded interface formed between thin glass and any one of the organic materials listed above; substrates made of composite materials with barrier performance having at least one bonded interface formed between alternately laminated layers of an inorganic material (such as $SiO_2$, $Al_2O_3$, $SiO_xN_y$) and an organic material; stainless steel substrates; multilayer metal substrates including a stainless steel layer and a layer of a different metal; aluminum substrates; and aluminum substrates with an oxide film formed by applying an oxidation treatment (such as anodization) on a surface thereof to improve insulating performance at the surface.

A first aspect of the method of producing the thin-film transistor of the invention is a method of producing a thin-film transistor including an oxide semiconductor layer, a source electrode, a drain electrode, a gate insulating film and a gate electrode formed on a substrate, the method including:

a film formation step of forming the oxide semiconductor layer through sputtering, wherein the oxide semiconductor layer includes a first area, a second area and a third area forming a well-type potential in the film-thickness direction, the first area forming a well of the well-type potential and having a first electron affinity, the second area being disposed nearer to the gate electrode than the first area and having a second electron affinity smaller than the first electron affinity, and the third area being disposed farther from the gate electrode than the first area and having a third electron affinity smaller than the first electron affinity, wherein the film formation step includes forming the first area under a first value of oxygen partial pressure/argon partial pressure in a film formation chamber, forming the second area under a second value of oxygen partial pressure/argon partial pressure in the film formation chamber, and forming the third area under a third value of oxygen partial pressure/argon partial pressure in the film formation chamber lower than the first value of oxygen partial pressure/argon partial pressure.

The second value of oxygen partial pressure/argon partial pressure may be lower than the first value of oxygen partial pressure/argon partial pressure.

A second aspect of the method of producing a thin-film transistor of the invention is a method of producing a thin-film transistor including an oxide semiconductor layer, a source electrode, a drain electrode, a gate insulating film and a gate electrode formed on a substrate, the method including:

a film formation step of forming the oxide semiconductor layer through sputtering, wherein the oxide semiconductor layer includes a first area, a second area and a third area forming a well-type potential in the film-thickness direction, the first area forming a well of the well-type potential and having a first electron affinity, the second area being disposed nearer to the gate electrode than the first area and having a second electron affinity smaller than the first electron affinity, and the third area being disposed farther from the gate electrode than the first area and having a third electron affinity smaller than the first electron affinity, wherein the film formation step includes applying oxygen-containing radicals to a surface on which the first area is formed during and/or after formation of the first area.

A third aspect of the method of producing a thin-film transistor of the invention is a method of producing a thin-film transistor including an oxide semiconductor layer, a source electrode, a drain electrode, a gate insulating film and a gate electrode formed on a substrate, the method including:

a film formation step of forming the oxide semiconductor layer through sputtering, wherein the oxide semiconductor layer includes a first area, a second area and a third area forming a well-type potential in the film-thickness direction, the first area forming a well of the well-type potential and having a first electron affinity, the second area being disposed nearer to the gate electrode than the first area and having a second electron affinity smaller than the first electron affinity, and the third area being disposed farther from the gate electrode than the first area and having a third electron affinity smaller than the first electron affinity, wherein the film formation step includes applying ultraviolet light in an ozone atmosphere to a surface on which the first area is formed during and/or after formation of the first area.

In the first to third aspects of the method of producing a thin-film transistor of the invention, the substrate may not be exposed to atmosphere during the film formation step.

A display device of the invention includes the thin-film transistor of the invention.

An image sensor of the invention includes the thin-film transistor of the invention.

An X-ray sensor of the invention includes the thin-film transistor of the invention.

An X-ray digital imaging device of the invention includes the X-ray sensor of the invention.

The X-ray digital imaging device of the invention may be capable of photographing a moving image.

The thin-film transistor of the invention has a structure in which the first area of the oxide semiconductor layer is sandwiched between the second and third areas having lower electron affinities. Therefore, a well-type potential structure where the lower end of the conduction band of the first area is lower than the lower ends of the conduction bands of the second and third areas is formed, and this causes the electron carrier flows into the first area. Thus, the carrier density at the first area can be increased without changing the composition ratio and the oxygen deficiency, and thus high mobility is provided.

In general, with respect to oxide semiconductors, the oxygen deficiency is increased to increase the carrier density. However, the oxygen deficiency causes decrease of the mobility. In the invention, it is not necessary to increase the oxygen deficiency at the first area forming the well layer. Therefore, decrease of the mobility due to oxygen vacancy in the first area forming the channel layer is suppressed, and thus the mobility is increased.

Since the first to third areas of the oxide semiconductor layer are made of the same type of materials, defect density at the interface is smaller than a case where the first area forming the channel layer is in contact with a different material. Thus, a thin-film transistor which also has good uniformity, stability and reliability is provided.

In the invention, in the case where the oxide semiconductor layer is an amorphous film, it can be formed at a low temperature of 300° C. or less. This facilitates formation of the oxide semiconductor layer on a flexible resin substrate, such as a plastic substrate, and thus facilitates application of the thin-film transistor of the invention to a flexible display using a plastic substrate with a thin-film transistor. Further, the amorphous film facilitates formation of an uniform film over a large area and does not have a grain boundary, which is the case with a polycrystal. Therefore, it is easy to suppress variation of device characteristics.

The display device of the invention is provided with the thin-film transistor of the invention, which has high mobility. Therefore, a high-definition display having low power consumption can be accomplished.

The X-ray sensor of the invention is provided with the thin-film transistor of the invention, which has good reliability. Therefore, high sensitivity characteristics with high S/N can be accomplished.

The X-ray digital imaging device of the invention is provided with the X-ray sensor including the transistor having high mobility. Therefore, the X-ray digital imaging device of the invention is light and flexible, can provide images with wide dynamic range, and is suitable, in particular, for photographing a moving image because of its high-speed performance.

BRIEF DESCRIPTION OF THE DRAWINGS

FIG. 9 shows Tauc plots with respect to Samples 6 and 7 (at A) and Samples 8 and 9 (at B), FIG. 11 shows excitation light energy and normalized electron yield with respect to Samples 6 and 7 (at A) and Samples 8 and 9 (at B), FIG. 15 shows specific resistance (at A), carrier density (at B) and mobility (at C) with respect to a multilayer film and a single film.

DESCRIPTION OF THE PREFERRED EMBODIMENTS

Figure 3:
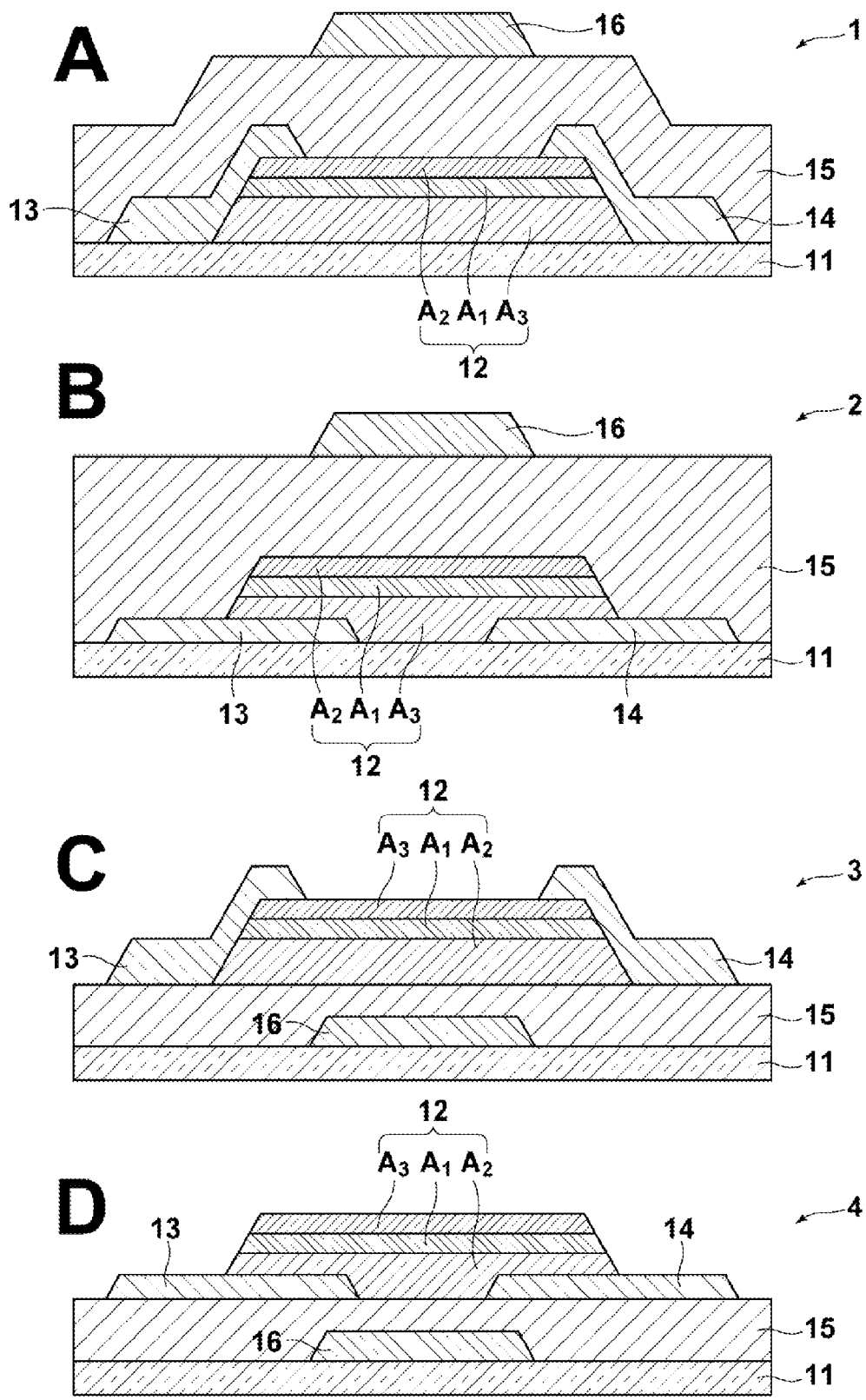
FIG. 3 is a sectional view schematically illustrating a top gate-top contact structure (at A), a top gate-bottom contact structure (at B), a bottom gate-top contact structure (at C), and a bottom gate-bottom contact structure (at D) of thin-film transistors.

Hereinafter, embodiments of the present invention will be described with reference to the drawings.
Thin-Film Transistor FIG. 3 is a sectional view schematically illustrating, at "A" to "D", structures of thin-film transistors 1 to 4 according to first to fourth embodiments of the invention. Components that are common among the thin-film transistors shown at "A" to "D" in FIG. 3 are denoted by the same reference numerals.

Each of the thin-film transistors 1 to 4 according to the embodiments of the invention includes an oxide semiconductor layer 12, a source electrode 13, a drain electrode 14, a gate insulating film 15 and a gate electrode 16 formed on a substrate 11, where the oxide semiconductor layer 12 includes first to third areas $A_1$ to $A_3$ which form a well-type potential in the film-thickness direction (see "A" to "D" in FIG. 3).

The first area $A_1$ forms a well of the well-type potential (see at "A" in FIG. 2) and has a first electron affinity $X_1$. The second area $A_2$ is disposed nearer to the gate electrode 16 than the first area $A_1$ and has a second electron affinity $X_2$ that is smaller than the first electron affinity $X_1$. The third area $A_3$ is disposed farther from the gate electrode 16 than the first area $A_1$ and has a third electron affinity $X_3$ that is smaller than the first electron affinity $X_1$.

Potential differences among the areas $A_1$ to $A_3$ can be provided by providing the areas $A_1$ to $A_3$ with different oxygen concentrations and/or cationic composition ratios. In the invention, at least the oxygen concentration of the third area $A_3$ is lower than the oxygen concentration at the first area $A_1$. By providing the oxygen concentration at the first area $A_1$ higher than that at the third area $A_3$, the electron affinity $X_1$ at the first area $A_1$ larger than the electron affinity $X_3$ at the third area $A_3$ can be provided.

The thin-film transistor 1 of the first embodiment shown at "A" in FIG. 3 is a top gate-top contact transistor. The thin-film transistor 2 of the second embodiment shown at "B" in FIG. 3 is a top gate-bottom contact transistor. The thin-film transistor 3 of the third embodiment shown at "C" in FIG. 3 is a bottom gate-top contact transistor. The thin-film transistor 4 of the fourth embodiment shown at "D" in FIG. 3 is a bottom gate-bottom contact transistor.

In the embodiments shown at "A" to "D" in FIG. 3, only positions of the gate electrode, the source electrode and the drain electrode relative to the oxide semiconductor layer are different, and the components denoted by the same reference numerals have the same functions, respectively, and therefore the same materials can be applied.

Now, each of the components is described in detail.
(Substrate)

The shape, structure, size, etc., of the substrate 11 forming the thin-film transistor 1 are not particularly limited, and can be selected as appropriate according to the purpose. The structure of the substrate may be a single layer structure or a multilayer structure.

Examples of the substrate 11 may include inorganic materials, such as YSZ (yttrium-stabilized zirconium) or glass, resins and composite resin materials.

In particular, a substrate made of a resin or a composite resin material may be used in view of lightweight and flexibility. Specific examples thereof may include: a substrates made of a synthetic resin, such as polybutylene terephthalate, polyethylene terephthalate, polyethylene naphthalate, polybutylene naphthalate, polystyrene, polycarbonate, polysulfone, polyethersulfone, polyallylate, allyl diglycol carbonate, polyamide, polyimide, polyamideimide, polyetherimide, polybenzoxazole, polyphenylene sulfide, polycycloolefin, norbornene resin, fluorine resin (such as polychlorotrifluoroethylene), liquid crystal polymer, acrylic resin, epoxy resin, silicone resin, ionomer resin, cyanate resin, cross-linked diester fumarate, cyclic polyolefin, aromatic ether, maleimide-olefin, cellulose or episulfide compound; a substrate made of a composite plastic material of any of the above-listed synthetic resins, or the like, and silicon oxide particles; a substrate made of a composite plastic material of any of the above-listed synthetic resins, or the like, and metal nanoparticles, inorganic oxide nanoparticles or inorganic nitride nanoparticles; a substrate made of a composite plastic material of any of the above-listed synthetic resins, or the like, and carbon fiber or carbon nanotube; a substrate made of a composite plastic material of any of the above-listed synthetic resins, or the like, and glass flake, glass fiber or glass beads; a substrate made of a composite plastic material of any of the above-listed synthetic resins, or the like, and a clay mineral of particles having a mica-derived crystal structure; a multilayer plastic substrate having at least one bonded interface between thin glass and any of the above-listed synthetic resins; a substrate made of a composite material with barrier performance having at least one bonded interface between an inorganic layer and an organic layer (any of the above-listed synthetic resins, or the like) which are laminated alternately; a stainless steel substrate or a multilayer metal substrate including a stainless steel layer and a layer of a different metal; and an aluminum substrate with an oxide film formed by applying an oxidation treatment (such as anodization) on a surface thereof to improve insulating performance at the surface.

The resin substrate may be one having good heat resistance, dimensional stability, solvent resistance, electrical insulating performance, workability, low air permeability, and low hygroscopicity.

The resin substrate may include a gas barrier layer for preventing permeation of moisture and oxygen, an undercoat layer for improving flatness of the resin substrate and adhesion between the resin substrate and the lower electrode, etc.

The thickness of the substrate may be not less than 50 μm and not more than 500 μm. The thickness of the substrate not less than 50 μm provides improved flatness of the substrate itself. The thickness of the substrate not more than 500 μm provides improved flexibly of the substrate itself and facilitates the use of the substrate for a flexible device. It should be noted that the thickness that provides sufficient flatness and flexibility varies depending on the material forming the substrate, and therefore it is necessary to determine the thickness of the substrate depending on the material; however, the thickness may generally be in the range from 50 μm to 500 μm.

(Oxide Semiconductor Layer)

The oxide semiconductor layer 12 includes the first to third areas $A_1$ to $A_3$ having the first to third electron affinities $X_1$ to $X_3$, as described above, and at least the oxygen concentration at the third area $A_3$ is lower than the oxygen concentration at the first area $A_1$.

The potential difference between the first area $A_1$ and the second area $A_2$ can be achieved by making the oxygen concentration at the second area $A_2$ lower than the oxygen concentration at the first area $A_1$. In a case where these areas are made of the same elements with the same composition ratio, a higher electron affinity is provided by a higher oxygen concentration.

The different electron affinities at the areas $A_1$ to $A_3$ to form the well-type potential along the direction in which the layers are laminated can also be achieved by varying the cationic composition ratios at the areas $A_1$ to $A_3$. Therefore, the well-type potential may be formed by further providing different cationic composition ratios at the first area and the second area, and different cationic composition ratios at the first area and the third area. It should be noted that any combination of the modulation of the oxygen concentration and the modulation of the cationic composition ratio may be used to achieve the well-type potential. For example, even if the oxygen concentration at the first area is lower than the oxygen concentration at the second area and this difference of the oxygen concentration provides a lower potential at the second area than the potential at the first area, the cationic composition ratios at the first and second areas may be determined to compensate for this potential difference and finally provide the first potential lower than the second potential.

Figure 1:
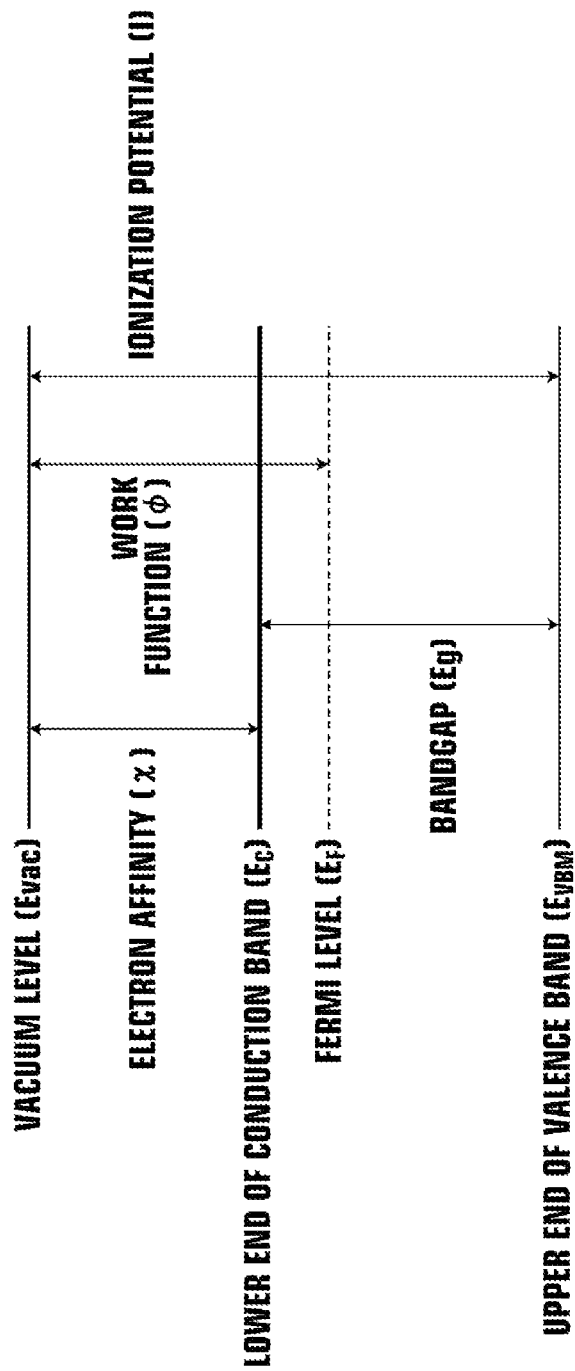
FIG. 1 is a diagram for explaining parameters of an electron structure of a semiconductor.
Figure 2:
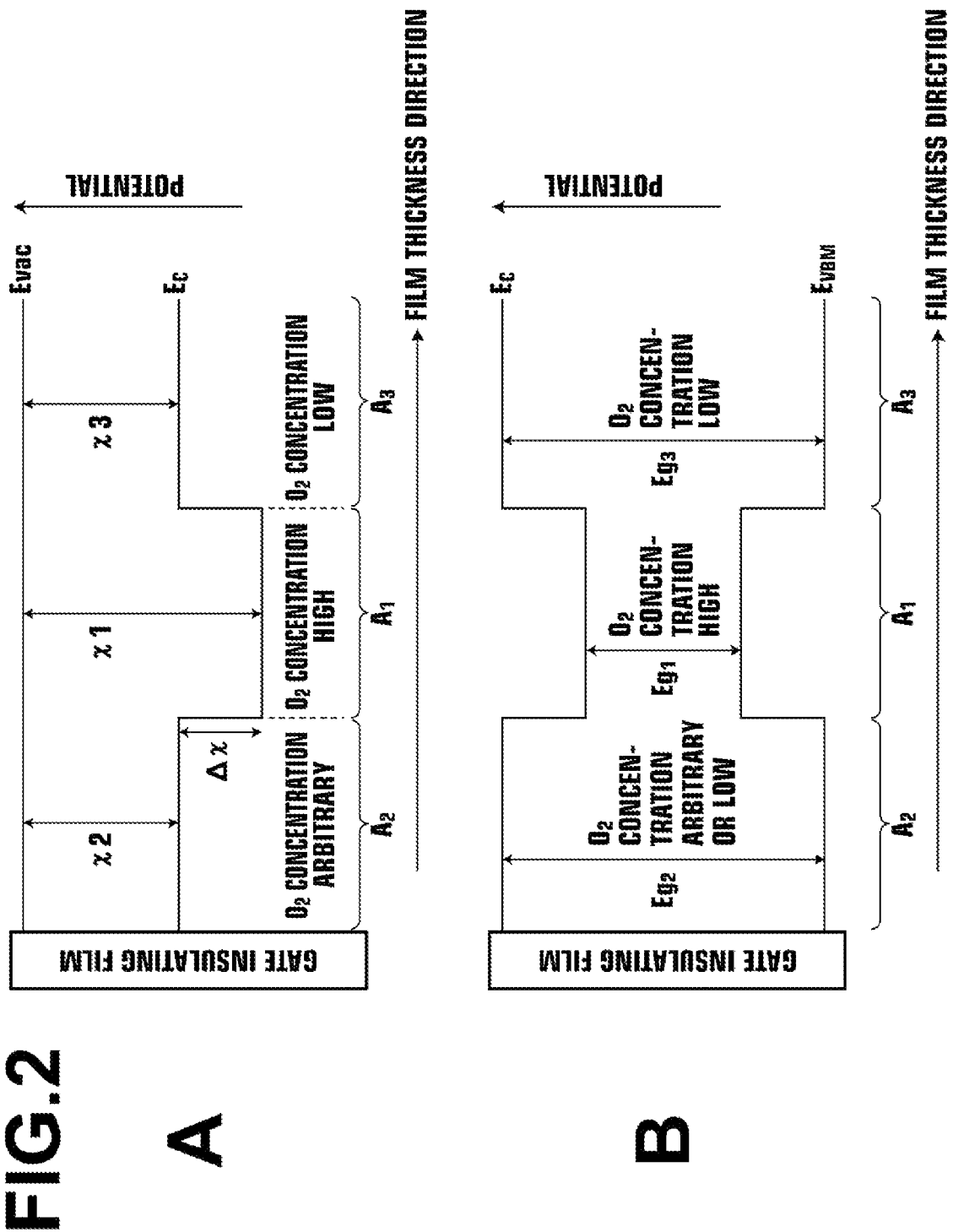
FIG. 2 is a diagram illustrating a potential structure provided by a difference of electron affinity (at A) and a bandgap energy structure (at B).

As shown at "B" in FIG. 2, the bandgaps $Eg_2$ and $Eg_3$ at the second area $A_2$ and the third area $A_3$ may be larger than the bandgap $Eg_1$ at the first area $A_1$.

Specifically, the control of the oxygen concentration may be achieved by forming the second area and/or the third area under a condition where an oxygen partial pressure is relatively low, and forming the first area under a condition where the oxygen partial pressure is relatively high. Alternatively, the control of the oxygen concentration may be achieved by applying oxygen radicals or ozone after formation of the first area to promote oxidation of the film, thereby reducing oxygen deficiency in the first area.

The oxygen deficiency at the first area may be very low. Conventionally, in the case where an oxide semiconductor layer is used as the channel layer, it is necessary to increase the carrier density to some extent to increase the mobility. To this end, the oxygen deficiency is intentionally formed, i.e., a low oxygen concentration is provided. However, if high oxygen deficiency is provided, the oxygen defect it self causes scattering of the carrier, resulting in low mobility. In the invention, the carrier serving as the channel layer is supplied from the third area and/or the second area. Therefore, a sufficient carrier density, and therefore sufficient mobility can be provided even with very low oxygen deficiency at the first area.

Each of the areas $A_1$ to $A_3$ of the oxide semiconductor layer 12 may contain at least one element selected from the group consisting of Al, Sc, Ti, Mn, Fe, Ga, Y, In, Sn, Ho, Er, Tm, Yb and Lu, and at least one element selected from the group consisting of Mg, Ca, Ni, Zn, Sr and Ba.

Alternatively, each of the areas $A_1$ to $A_3$ of the oxide semiconductor layer 12 may contain at least one of In and Ga.

In particular, each of the areas $A_1$ to $A_3$ of the oxide semiconductor layer 12 may be made of:

$$a(In_2O_3) \cdot b(Ga_2O_3) \cdot c(ZnO) \qquad \text{General Formula,}$$

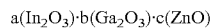

where $a \geq 0$, $b \geq 0$, $c \geq 0$, $a+b \neq 0$, $b+c \neq 0$ and $c+a \neq 0$.

In this case, the value of $b/(a+b)$ at the first area $A_1$ may be smaller than the values of $b/(a+b)$ at the second area $A_2$ and the third area $A_3$. In this case, the value of $Ga/(In+Ga)$ (which is equivalent to the value of $b/(a+b)$ in the General Formula) at the first area $A_1$ may be not more than 0.95. Further, the values of $b/(a+b)$ at the second area $A_2$ and the third area $A_3$ may be not less than 0.5.

By increasing the difference between the values of $b/(a+b)$ at the first area and the second area and the difference between the values of $b/(a+b)$ at the first area and the third area, the energy gap at the lower end of the conduction band is increased, and the electron carrier can efficiently be localized at the first area.

Further, a value of $Zn/(In+Ga)$ (equivalent to $2c/(a+b)$ in the above general formula) at the first area forming the oxide semiconductor layer in the invention may be not more than 0.5, and the values of $2c/(a+b)$ at the second area and the third area may be not less than 0.5. As the value of $Zn/(In+Ga)$ increases, the optical absorption edge shifts to the longer wavelength side, and as the value of $Zn/(In+Ga)$ increases, the bandgap becomes narrower. Therefore, when an IGZO layer having a relatively small value of $Zn/(In+Ga)$ is positioned at the first area, and IGZO layers having relatively large values of $Zn/(In+Ga)$ are positioned at the second area and the third area, the energy gap at the lower end of the conduction band can be provided, and the electron carrier can be localized at the first area. In a case where the approach of controlling the values of $Zn/(In+Ga)$ at the first to third areas is applied to a film provided with a larger difference between the values of $Ga/(In+Ga)$ at the first to third areas, a deeper well-type potential structure can be formed. The approach of controlling the values of $Zn/(In+Ga)$ is also applicable to a case where the first to third areas have the same value of $Ga/(In+Ga)$.

Further, by doping an element ion which provides a wider bandgap to a part of Zn of the oxide semiconductor layer made of IGZO, a deeper well-type potential structure can be provided. Specifically, Mg doping can provide a larger bandgap of the film. For example, by doping Mg only to the second area and the third area, a deeper well-type potential structure can be formed. Further, by doping Mg to each area in a state where different values of b/(a+b) and different values 2c/(a+b) are provided between the first area and the second area and between the first area and the third area, a wider bandgap of the entire oxide semiconductor layer can be provided, while maintaining the height of the well barrier, than a system where only the composition ratio of In, Ga and Zn is controlled.

A blue-light emitting layer used in an organic EL exhibits broad light emission having a peak around $\lambda$=450 nm. Therefore, if the optical bandgap of the IGZO film is relatively narrow and has optical absorption in the region, this results in threshold shift of the transistor. Therefore, in the case where the thin-film transistor is used for driving an organic EL, in particular, the material forming the channel layer may be selected to provide a larger bandgap.

If the value of Ga/(In+Ga) in IGZO is increased, the optical absorption edge shifts to the shorter wavelength side and a wider bandgap is provided; however, the electric conductivity decreases at the same time. In other words, if a IGZO film having a large value of Ga/(In+Ga) is used singly in the thin-film transistor, it is impossible to provide desired transistor characteristics (specifically, mobility over several tens to hundreds $cm^2/Vs$) (see FIG. 15). In the invention, the well-type energy structure is formed using the structure where the oxide semiconductor layer (the first area) having a relatively narrow bandgap and a small value of Ga/(In+Ga) is sandwiched between the oxide semiconductor layers (the second area and the third area) having a wide bandgap and a large value of Ga/(In+Ga), thereby localizing the carrier at the first area.

The carrier density at the first area can arbitrarily be controlled by controlling the oxygen deficiency at the second area or the third area or doping a cation to the second area or the third area. When it is desired to increase the carrier density, the oxygen deficiency at the second area or the third area may be increased, or a material having a relatively large valence and tending to form a cation (such as Ti, Zr, Hf or Ta) may be doped to the second area or the third area. However, if a cation with a large valence is doped, the number of constituent elements of the oxide semiconductor film is increased, and this is disadvantageous in view of simplification of the film formation process and cost reduction. Therefore, the control of the carrier density may better be achieved by controlling the oxygen concentration (oxygen deficiency).

The control of the carrier density at the first area can be achieved by applying the above-described treatment to either of the second area and the third area. However, if a layer having a high carrier density is present at an area nearer to the gate electrode, mobility and characteristics at a sub-threshold area may be degraded. Therefore, the control of the carrier density at the first area may better be achieved by applying the above-described treatment to the third area.

The oxide semiconductor layer may be amorphous in view of allowing film formation at a temperature of 300° C. or less. For example, an amorphous IGZO film can be formed at a substrate temperature of 200° C. or less.

The total film thickness of the oxide semiconductor layer 12 may be in the range from about 30 to about 200 nm.

(Source Electrode, Drain Electrode)

The source electrode 13 and the drain electrode 14 are not particularly limited as long as they have high conductivity. For example, the source electrode 13 and the drain electrode 14 may have a single layer structure or a multilayer structure including two or more layers, which may be made of a metal, such as Al, Mo, Cr, Ta, Ti, Au or Ag, Al—Nd, a metal oxide conductive film, such as tin oxide, zinc oxide, indium oxide, indium tin oxide (ITO) or indium zinc oxide (IZO).

The source electrode 13 and the drain electrode 14 may be formed by a method which is selected as appropriate with considering the compatibility with the material used, and examples of the method include wet processes, such as printing or coating, physical processes, such as vacuum vapor deposition, sputtering, ion plating, and chemical processes, such as CVD and plasma CVD.

In the case where the source electrode 13 and the drain electrode 14 are formed using any of the above-listed metals, the thickness of the source electrode 13 and the drain electrode 14 may be not less than 10 nm and not more than 1000 nm, or optionally not less than 50 nm and not more than 100 nm, in view of ease of film formation, patternability through etching or a liftoff process and conductivity.

(Gate Insulating Film)

The gate insulating film 15 may be one having high insulating performance, and examples thereof may include an insulating film, such as $SiO_2$, SiNx, SiON, $Al_2O_3$, $Y_2O_3$, $Ta_2O_5$ or $HfO_2$, or an insulating film including at least two of these compounds.

The gate insulating film 15 may be formed by a method which is selected as appropriate with considering the compatibility with the material used, and examples of the method include wet processes, such as printing or coating, physical processes, such as vacuum vapor deposition, sputtering, ion plating, and chemical processes, such as CVD and plasma CVD.

It should be noted that the gate insulating film 15 needs to have an enough thickness to reduce the leakage current and increase the voltage resistance. However, if the thickness is too large, the driving voltage increases. The thickness of the gate insulating film 15 may be in the range from 10 nm to 10 μm, optionally be in the range from 50 nm to 1000 nm, or further optionally be in the range from 100 nm to 400 nm, although the thickness depends on the material.

(Gate Electrode)

The gate electrode 16 is not particularly limited as long as it has high conductivity. For example, the gate electrode 16 may have a single layer structure or a multilayer structure including two or more layers, which may be made of a metal, such as Al, Mo, Cr, Ta, Ti, Au or Ag, Al—Nd, a metal oxide conductive film, such as tin oxide, zinc oxide, indium oxide, indium tin oxide (ITO) or indium zinc oxide (IZO).

The gate electrode 16 may be formed by a method which is selected as appropriate with considering the compatibility with the material used, and examples of the method include wet processes, such as printing or coating, physical processes, such as vacuum vapor deposition, sputtering, ion plating, and chemical processes, such as CVD and plasma CVD.

In the case where the gate electrode 16 is formed using any of the above-listed metals, the thickness of the gate electrode 16 may be not less than 10 nm and not more than 1000 nm, or optionally not less than 50 nm and not more than 200 nm, in view of ease of film formation, patternability through etching or a liftoff process and conductivity.

(Method of Producing Thin-Film Transistor)

A method of producing the top gate-top contact thin-film transistor 1 shown at "A" in FIG. 3 is briefly described.

The substrate 11 is prepared, and the third area $A_3$, the first area $A_1$ and the second area $A_2$ of the oxide semiconductor layer 12 are formed in this order on the substrate 11 using a film formation technique, such as sputtering.

Then, the oxide semiconductor layer 12 is patterned. The patterning can be achieved through photolithography and etching. Specifically, a resist pattern is formed through photolithography on areas to be left, and a pattern is formed through etching using an acidic solution of, for example, hydrochloric acid, nitric acid, dilute sulfuric acid, or a mixed solution of phosphoric acid, nitric acid and acetic acid.

Subsequently, a metal film which forms the source electrode 13 and the drain electrode 14 is formed on the oxide semiconductor layer 12.

Then, the metal film is patterned into a predetermined shape through etching or a liftoff process to form the source electrode 13 and the drain electrode 14. At this time, the source electrode 13, the drain electrode 14 and wiring (not shown) connecting to these electrodes may be patterned at once.

After the source electrode 13, the drain electrode 14 and the wiring have been formed, the gate insulating film 15 is formed. The gate insulating film 15 is patterned into a predetermined shape through photolithography and etching.

After the gate insulating film 15 has been formed, the gate electrode 16 is formed. After an electrode film is formed, the electrode film is patterned into a predetermined shape through etching or a liftoff process to form the gate electrode 16. At this time, the gate electrode 16 and gate wiring may be patterned at once.

The thin-film transistor 1 shown at "A" in FIG. 3 can be produced by the above-described procedure.

(Film Formation Process to Form Oxide Semiconductor Layer)

Next, the film formation process to form the oxide semiconductor layer is described in more detail.

The total film thickness of the oxide semiconductor layer 12 may be in the range from about 30 to about 200 nm, and the areas of the oxide semiconductor layer 12 may be formed continuously without being exposed to atmosphere. If the areas of the oxide semiconductor layer 12 are formed continuously without being exposed to atmosphere, better transistor characteristics can be provided. Further, the number of steps in the film formation process can be reduced, thereby reducing the production costs.

In this embodiment, as has been described above, the third area $A_3$ the first area $A_1$ and the second area $A_2$ of the oxide semiconductor layer are formed in this order. If a bottom-gate thin-film transistor is produced, the oxide semiconductor layer is formed in order of the second area $A_2$, the first area $A_1$ and the third area $A_3$.

First, the third area $A_3$ is formed. At this time, for example, a 100 nm-thick InGaZnO film, where Ga/(In+Ga)=0.75 and Zn/(In+Ga)=0.5, is formed as the third area $A_3$.

As a technique to form the film to achieve the above-described composition ratio of the metal elements, sputtering may be used. Examples of the sputtering may include: co-sputtering using combination of targets of $1n$, Ga and Zn, or oxides or composite oxides thereof; and single sputtering using a composite oxide target, which is prepared in advance to achieve the above-described composition ratio of the metal elements in the formed IGZO film. The substrate temperature during the film formation may arbitrarily be selected depending on the substrate. If a flexible substrate is used, the substrate temperature may be nearer to the room temperature.

If a higher carrier density is desired at the third area, a relatively low oxygen partial pressure is provided in the film formation chamber during the film formation to reduce the oxygen concentration in the film. For example, a value of oxygen partial pressure/argon partial pressure during the film formation may be 0.005. In contrast, if a lower electron carrier density is desired, a relatively high oxygen partial pressure is provided in the film formation chamber during the film formation (for example, the value of oxygen partial pressure/argon partial pressure during the film formation may be 0.05), or oxygen radicals are applied during or after the film formation or ultraviolet light is applied to the surface of the substrate where the film is formed in an ozone atmosphere to increase the oxygen concentration in the film.

Then, film formation of the first area is carried out. The film formation of the first area may be achieved, for example, by once stopping the film formation after the third area has been formed and changing the oxygen partial pressure in the film formation chamber and the electric power applied to the target, and then, restarting the film formation, or by rapidly or slowly changing the oxygen partial pressure in the film formation chamber and the electric power applied to the target without stopping the film formation. Further, the same target (s) as that used to form the third area may be used to form the first area with changing the electric power to be applied. Alternatively, before the first area is formed after the third area has been formed, application of the electric power to the target used to form the third area may be stopped and the electric power may be applied to another target, or the electric power may be applied to one or more targets in addition to the target used to form the third area.

As the first area, for example, a 10 nm-thick IGZO film is formed to achieve the composition ratio of the metal elements of Ga/(In+Ga)=0.25 and Zn/(In+Ga)=0.5.

The substrate temperature during the film formation may arbitrarily be selected depending on the substrate. If a flexible substrate is used, the substrate temperature may be nearer to the room temperature.

During the film formation of the first area, in order to reduce the oxygen deficiency in the film, i.e., to provide a high oxygen concentration in the film, a high oxygen partial pressure may be provided in the film formation chamber during film formation, or oxygen radicals may be applied during or after the film formation, or ultraviolet light may be applied to the surface of the substrate where the film is formed in an ozone atmosphere. For example, the value of oxygen partial pressure/argon partial pressure in the film formation chamber during the film formation may be 0.05.

Finally, film formation of the second area is carried out. The film formation of the second area may be achieved, for example, by once stopping the film formation after the first area has been formed and changing the oxygen partial pressure in the film formation chamber and the electric power applied to the target, and then, restarting the film formation, or by rapidly or slowly changing the oxygen partial pressure in the film formation chamber and the electric power applied to the target without stopping the film formation. Further, the same target (s) as that used to form the first area may be used to form the second area with changing the electric power to be applied. Alternatively, before the second area is formed after the first area has been formed, application of the electric power to the target used to form the first area may be stopped and the electric power may be applied to another target, or the electric power may be applied to one or more targets in addition to the target used to form the first area.

As the second area, for example, a 10 nm-thick IGZO film is formed to achieve the composition ratio of the metal elements of Ga/(In+Ga)=0.75 and Zn/(In+Ga)=0.5.

The substrate temperature during the film formation may arbitrarily be selected depending on the substrate. If a flexible substrate is used, the substrate temperature may be nearer to the room temperature.

If a higher carrier density is desired at the second area, a lower oxygen partial pressure is provided in the film formation chamber during the film formation. For example, the value of oxygen partial pressure/argon partial pressure during the film formation may be 0.005. In contrast, if a lower electron carrier density is desired, a higher oxygen partial pressure is provided in the film formation chamber during film formation (for example, the value of oxygen partial pressure/argon partial pressure during film formation may be 0.05), or oxygen radicals are applied during or after the film formation or ultraviolet light is applied to the surface of the substrate where the film is formed in an ozone atmosphere.

It should be noted that, if the oxygen concentration in the film is increased by the application of oxygen radicals or the application of ultraviolet light in an ozone atmosphere, the application may be carried out during and after the film formation of the first area and the second area, or may be carried out after the film formation of the second area. Further, the substrate temperature during the application of oxygen radicals may arbitrarily be selected depending on the substrate. If a flexible substrate is used, the substrate temperature may be nearer to the room temperature.

In addition, anneal may be carried out after the oxide semiconductor layer has been formed. The atmosphere during anneal may arbitrarily be selected depending on the film, and the anneal temperature may arbitrarily be selected depending on the substrate. If a flexible substrate is used, the anneal may be carried out at a lower temperature (for example, 200° C. or less).

In contrast, if a substrate having high heat resistance is used, the anneal may be carried out at a high temperature near to 500° C.

Figure 16:
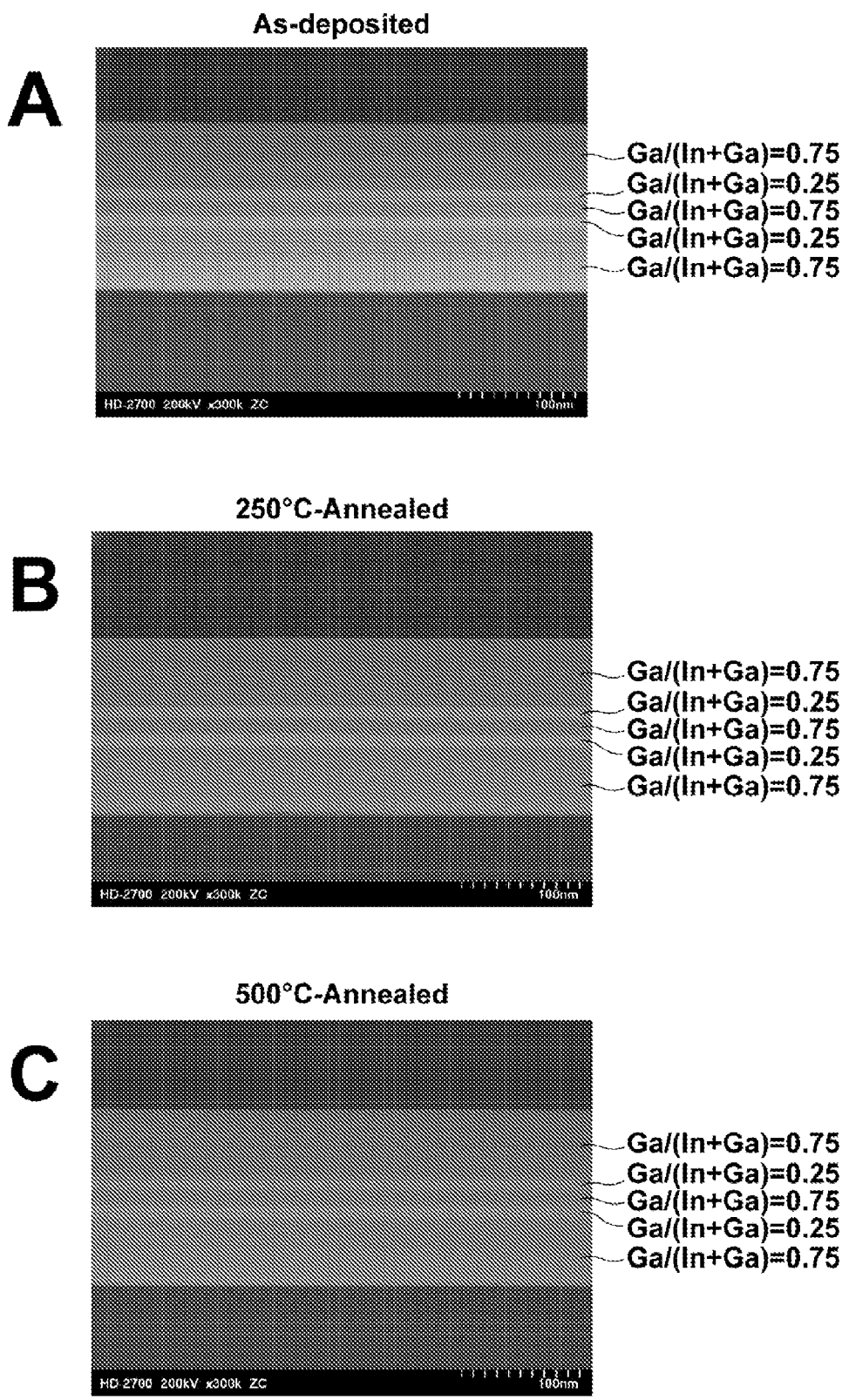
FIG. 16 shows cross-sectional STEM images of an IGZO multilayer film immediately after formation of layers (at A), after annealing at 250° C. (at B) and after annealing at 500° C. (at C)

FIG. 16 shows cross-sectional STEM images of a multilayer film including five layers of IGZO films with Ga/(In+Ga)=0.75 and IGZO films with Ga/(In+Ga)=0.25, where the image shown at "A" was taken immediately after the layers were formed (before annealing), the image shown at "B" was taken after anneal at a temperature of 250° C., and the image shown at "C" was taken after anneal at a temperature of 500° C. It can be seen from FIG. 16 that the multilayer structure is maintained even after the anneal at 500° C.

The present inventors have confirmed through the following experiment that, the electron affinity of an IGZO layer can be changed by controlling the cationic composition ratio and/or the oxygen concentration, and that a IGZO layer with a small energy gap can be used as the well layer by providing the well-type potential structure.

As has been described previously, the electron affinity X is determined by a difference between the ionization potential I and the bandgap energy Eg.

The bandgap energy Eg can be calculated using Tauc plot from measurements of reflectance and transmittance of light. The ionization potential I can be found by photoelectron spectroscopy measurement.

(Dependency of Electron Affinity X on Cationic Composition Ratio)

Samples 1 to 5 having different cationic composition ratios were produced and the above-described measurements were carried out to study dependency of the electron affinity X on the cationic composition ratio.

First, IGZO film Samples 1 to 5 having different cationic composition ratios were produced to measure the IGZO films. These Samples 1 to 5 were produced by forming IGZO films having different cationic composition ratios of Ga/(In+Ga) on substrates, respectively. The substrates used to produce these samples were synthetic quartz glass substrates (T-4040 available from Covalent Materials Corporation).

Sample 1 was produced by forming a 100 nm-thick IGZO film with Ga/(In+Ga)=0 and Zn/(In+Ga)=0.5 on a substrate. The film formation was achieved through co-sputtering using an $In_2O_3$ target, a $Ga_2O_3$ target and a ZnO target with the value of oxygen partial pressure/argon partial pressure during film formation of 0.01. The substrate temperature during the film formation was the room temperature, and the pressure in the film formation chamber during the film formation was kept at $4.4 \times 10^{-1}$ Pa by automatically controlling the aperture of the discharge valve.

Samples 2 to 5 were produced in the same procedure as that of sample 1, except that different values of Ga/(In+Ga) were provided. Sample 2 had Ga/(In+Ga)=0.25, sample 3 had Ga/(In+Ga)=0.5, sample 4 had Ga/(In+Ga)=0.75, and sample 5 had Ga/(In+Ga)=1.

Control of the values of Ga/(In+Ga) and Zn/(In+Ga) in Samples 1 to 5 was achieved by controlling values of electric power applied to the $In_2O_3$ target, the $Ga_2O_3$ target and the ZnO target.

Figure 4:
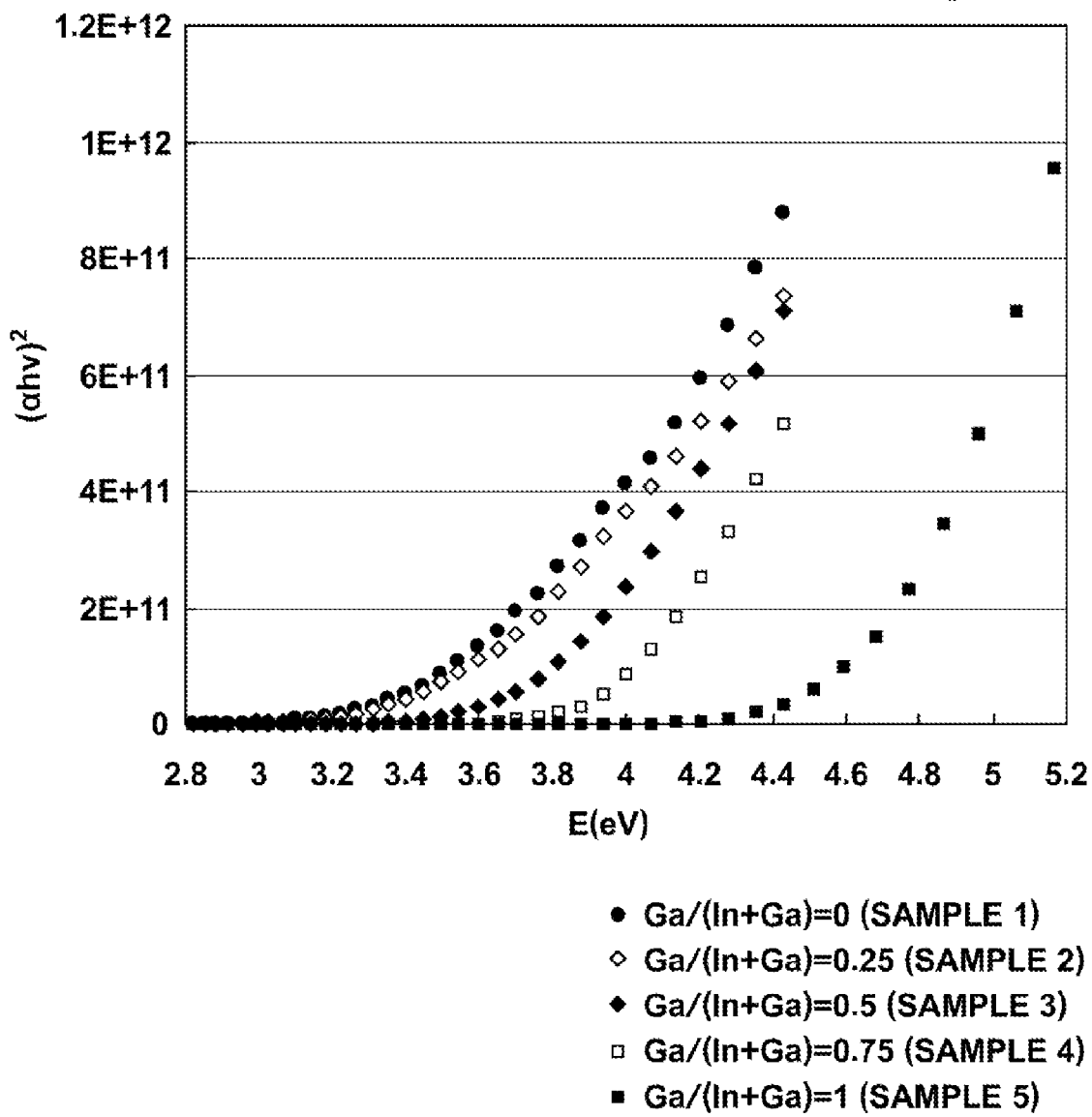
FIG. 4 shows Tauc plots with respect to Samples 1 to 5.

FIG. 4 shows Tauc plots of the results of the measurements of reflectance and transmittance of each of Samples 1 to 5. It can be seen that a larger value of Ga/(In+Ga) provided a higher bandgap energy.

Figure 5:
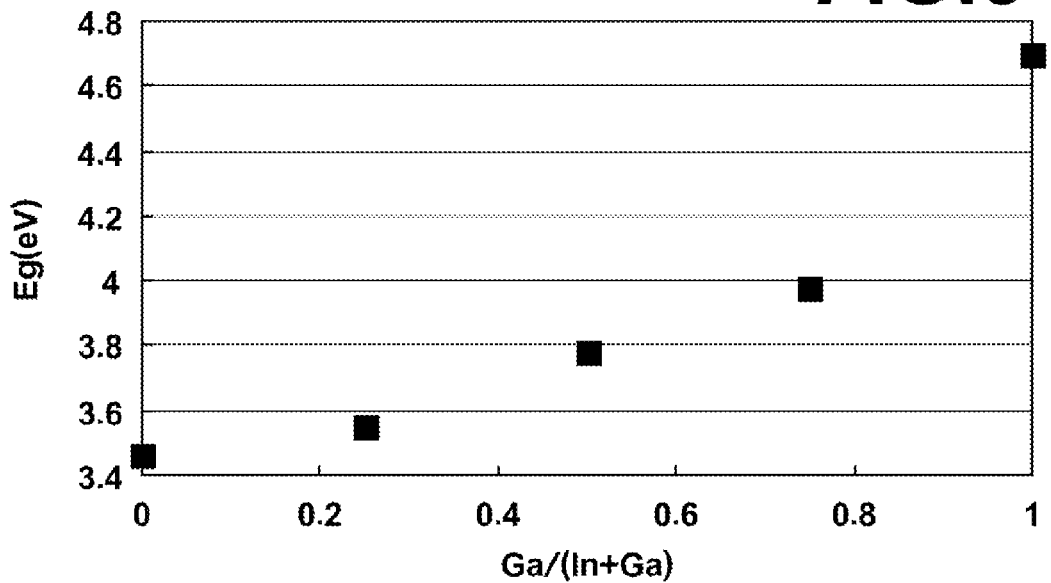
FIG. 5 shows dependency of bandgap energy on composition ratio derived from FIG. 4.

FIG. 5 shows the bandgap energy of each sample derived from the Tauc plots shown in FIG. 4. It can be seen from these results that the bandgap energy was increased by about 1.2 to 1.3 eV as the value of Ga/(In+Ga) was increased from 0 to 1.

Figure 6:
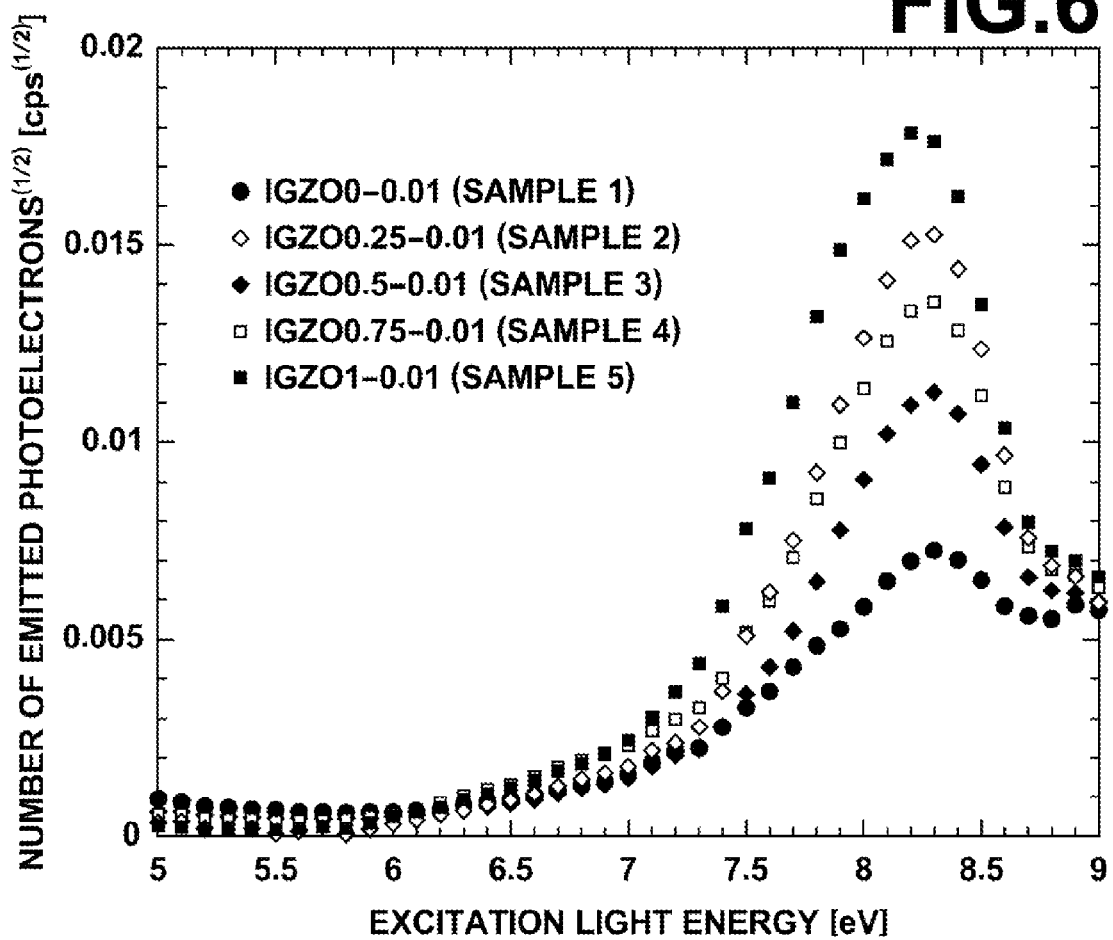
FIG. 6 shows excitation light energy and normalized photoelectron yield with respect to Samples 1 to 5.

FIG. 6 shows excitation light energy and normalized photoelectron yield in the photoelectron spectroscopy measurement of Samples 1 to 5. In the graph shown in FIG. 6, the excitation light energy at the rising portion of each curve, i.e., the energy value at which photoelectric emission begins indicates the ionization potential.

Figure 7:
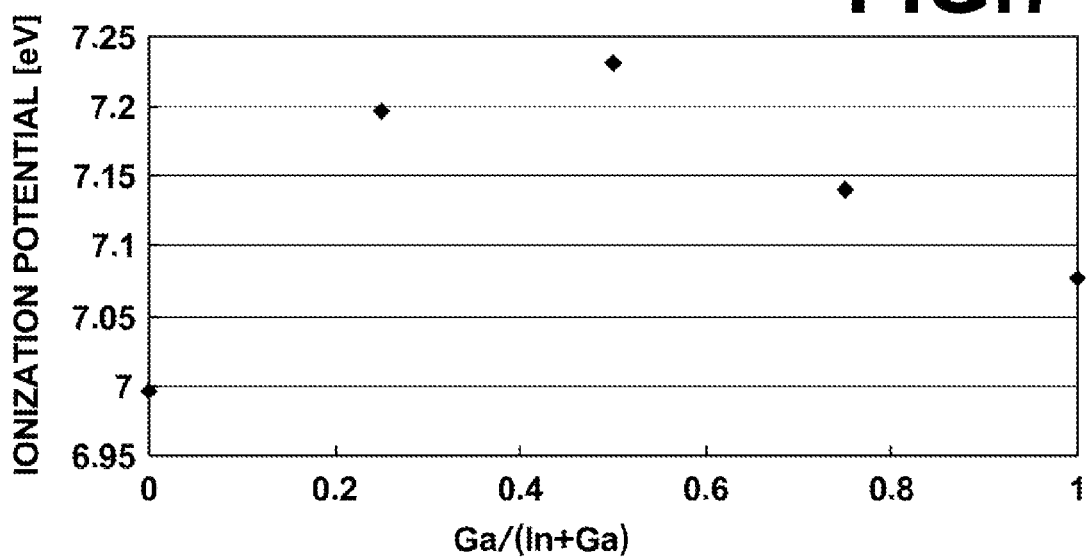
FIG. 7 shows dependency of ionization potential on composition derived from FIG. 6.

FIG. 7 is a graph showing the ionization potentials of Samples 1 to 5 found from the graph shown in FIG. 6. It can be seen from FIG. 7 that the ionization potential took the maximum value around the value of Ga/(In+Ga) of 0.5, and decreased as the value of the value of Ga/(In+Ga) increased or decreased from 0.5.

The electron affinity X of each of Samples 1 to 5 was calculated from a difference between the bandgap energy Eg and the ionization potential I obtained above.

Table 2 shown below is a list of the composition ratio, the value of oxygen partial pressure/argon partial pressure, the energy gap Eg, the ionization potential I and the electron affinity X of each sample.

TABLE 2

|  | Ga/(In + Ga) | Zn/(In + Ga) | O$_2$ partial pressure/Ar partial pressure | Energy gap Eg (eV) | Ionization potential energy I (eV) | Electron affinity $\chi$ (eV) |
|---|---|---|---|---|---|---|
| Sample 1 | 0 | 0.5 | 0.01 | 3.45 | 7.00 | 3.55 |
| Sample 2 | 0.25 | 0.5 | 0.01 | 3.55 | 7.19 | 3.64 |
| Sample 3 | 0.5 | 0.5 | 0.01 | 3.78 | 7.23 | 3.45 |
| Sample 4 | 0.75 | 0.5 | 0.01 | 3.98 | 7.14 | 3.16 |
| Sample 5 | 1 | 0.5 | 0.01 | 4.70 | 7.07 | 2.37 |

Figure 8:
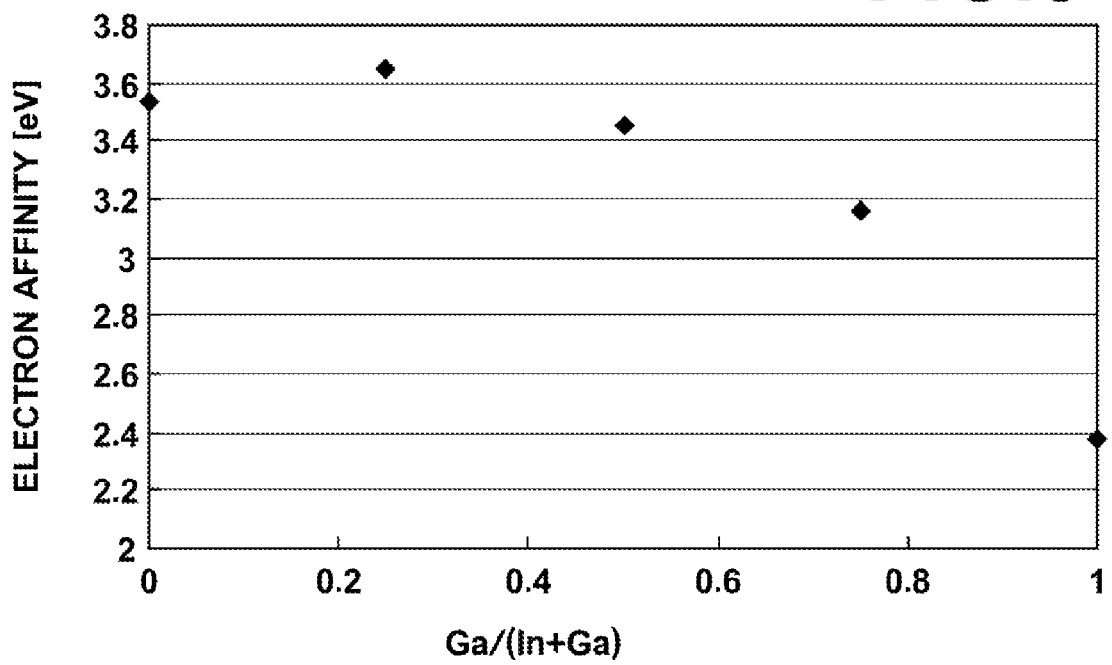
FIG. 8 shows dependency of electron affinity on composition.

FIG. 8 shows the dependency of the electron affinity on the value of Ga/(In+Ga) found from the above-described results. It can be seen that the electron affinity X took the maximum value around the value of Ga/(In+Ga) of 0.25, and decreased as the value of the value of Ga/(In+Ga) increased or decreased from 0.25. As the value of Ga/(In+Ga) increased from 0.25 to 1, the electron affinity decreased by about 1.2 to 1.3 eV.

As described above, it became clear that the electron affinity can be changed by changing the value of Ga/(In+Ga). Therefore, with respect to the oxide semiconductor layer made of InGaZnO, for example, a well-type structure with a potential difference of 0.48 eV can be provided by providing the value of Ga/(In+Ga) of 0.25 at the area A$_1$ and the value of Ga/(In+Ga) of 0.75 at the area A$_2$ (and the area A$_3$).

(Dependency of Electron Affinity X on Oxygen Concentration)

Samples 6 to 9 having different oxygen concentrations were produced and dependency of the electron affinity X, which was measured in the same manner, on the oxygen concentration was studied.

Similarly to the above-described Samples 1 to 5, samples 6 to 9 were produced by forming IGZO films in the same procedure on the same substrates as those of Samples 1 to 5 to measure the IGZO films.

The Sample 6 had Ga/(In+Ga)=0.75 and Zn/(In+Ga)=0.5, and the value of oxygen partial pressure/argon partial pressure during film formation was 0. Sample 7 had the same values of Ga/(In+Ga) and Zn/(In+Ga) as those of Sample 6, and the value of oxygen partial pressure/argon partial pressure during film formation was 0.01. Sample 8 had Ga/(In+Ga)=0.25 and Zn/(In+Ga)=0.5, and the value of oxygen partial pressure/argon partial pressure during film formation was 0, Sample 9 had the same values of Ga/(In+Ga) and Zn/(In+Ga) as those of sample 8, and the value of oxygen partial pressure/argon partial pressure during film formation was 0.01. Table 3 shows the composition ratio, the value of oxygen partial pressure/argon partial pressure, the energy gap, which will be described later, etc., of the thus produced samples 6 to 9.

plots shown at "B" in FIG. 9 show the results of Samples 8 and 9 having the value of Ga/(In+Ga) of 0.25. It can be seen that the bandgap energy Eg was not largely changed by changing the value of oxygen partial pressure/argon partial pressure during the film formation.

Figure 10:
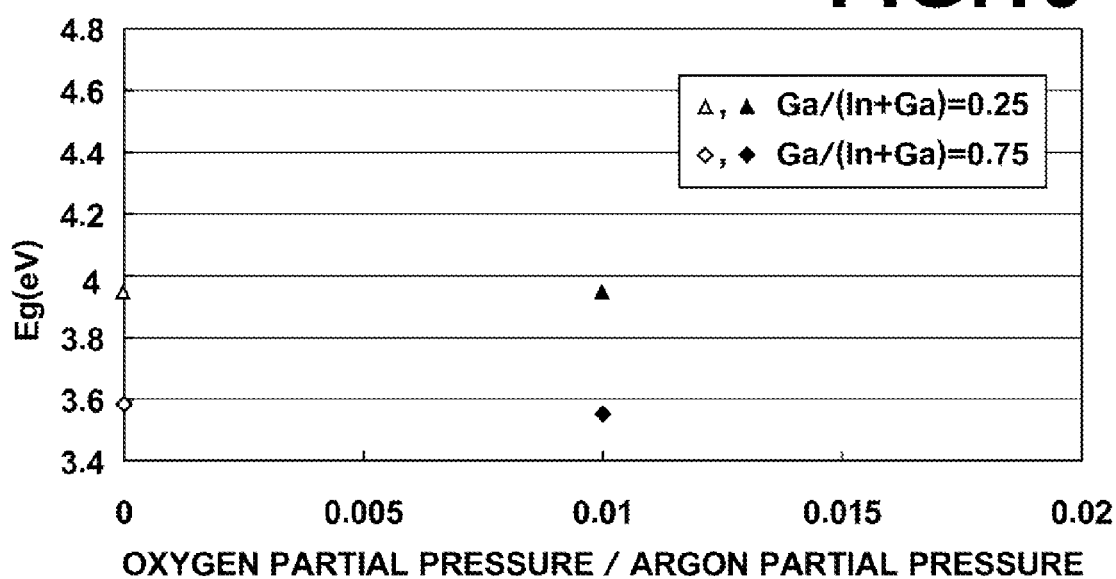
FIG. 10 shows dependency of bandgap energy on a value of oxygen partial pressure/argon partial pressure derived from FIG. 9.

FIG. 10 shows the bandgap energy of each sample derived from the Tauc plots shown at "A" and "B" in FIG. 9, with the value of oxygen partial pressure/argon partial pressure plotted along the abscissa axis. It can be seen from the results that the bandgap energy was scarcely changed by changing the value of oxygen partial pressure/argon partial pressure.

Figure 12:
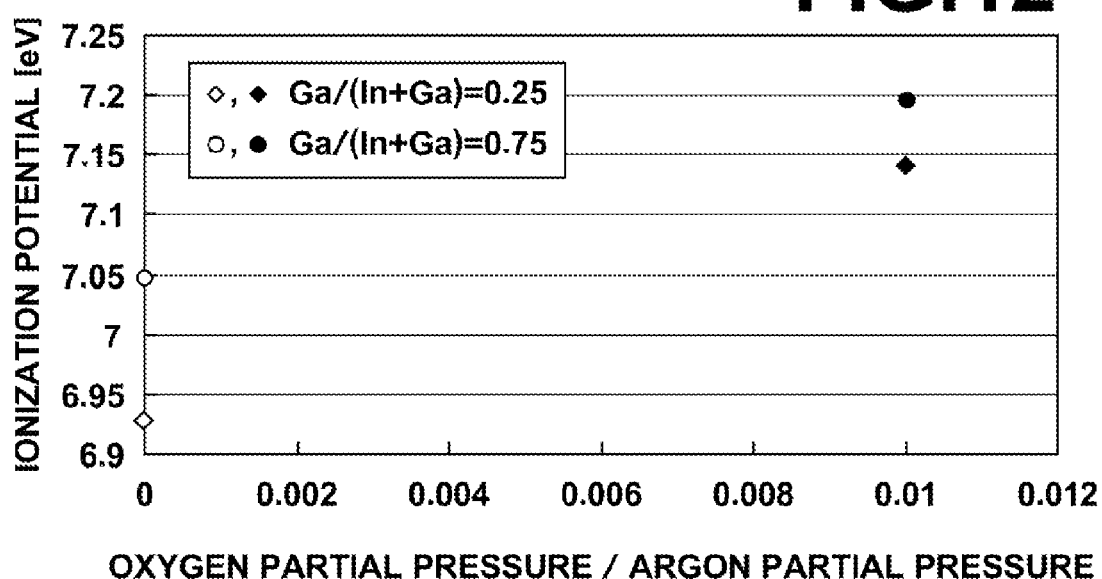
FIG. 12 shows dependency of ionization potential on the value of oxygen partial pressure/argon partial pressure derived from FIG. 11.

FIG. 11 shows excitation light energy and normalized photoelectron yield in the photoelectron spectroscopy measurement of Samples 6 and 7 at "A" and those of Samples 8 and 9 at "B". FIG. 12 shows the ionization potentials of the samples found from the graphs shown at "A" and "B" in FIG. 11. As can be seen from the results shown in FIG. 12, the ionization potential increased as the value of oxygen partial pressure/argon partial pressure during the film formation increased, even when the value of Ga/(In+Ga) was varied.

The electron affinity X of each of samples 6 to 9 was calculated from a difference between the bandgap energy Eg and the ionization potential I obtained above (see Table 3).

Figure 13:
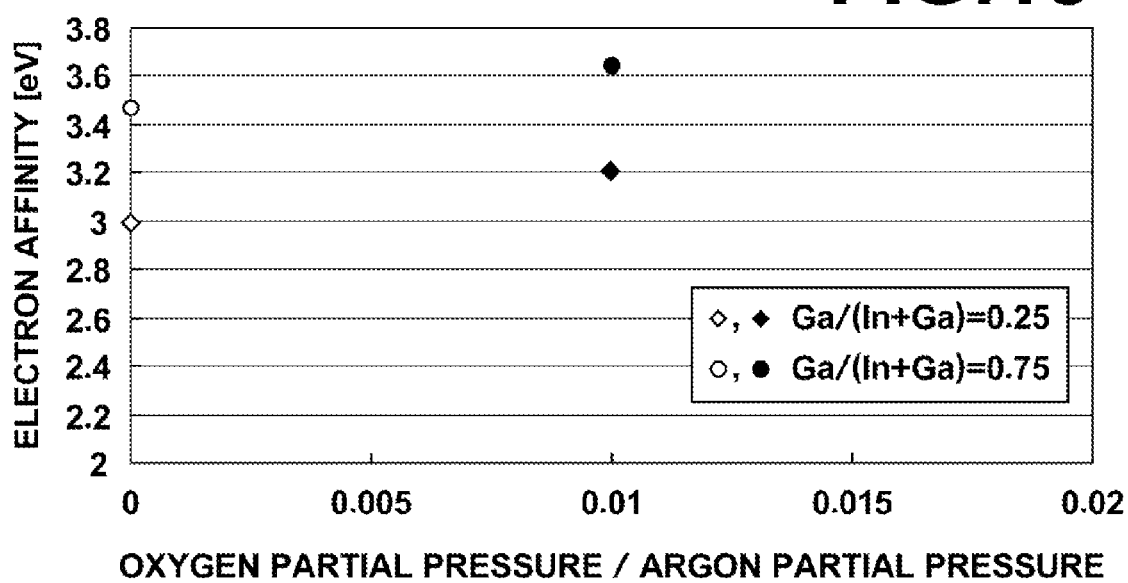
FIG. 13 shows dependency of electron affinity on the value of oxygen partial pressure/argon partial pressure.

FIG. 13 shows dependency of the electron affinity on the value of oxygen partial pressure/argon partial pressure during the film formation found from the above-described results. It can be seen that the electron affinity X increased as the value of oxygen partial pressure/argon partial pressure during the film formation increased. It can be seen that, as the value of oxygen partial pressure/argon partial pressure during film formation increased from 0 to 0.01, the electron affinity increased by about 0.2 eV in either of the cased where the value of Ga/(In+Ga) was 0.75 or 0.25.

As described above, it became clear that the electron affinity can be changed by changing the value of oxygen partial pressure/argon partial pressure during film formation. In particular, the electron affinity can be increased by increasing the value of oxygen partial pressure/argon partial pressure.

TABLE 3

|  | Ga/(In + Ga) | Zn/(In + Ga) | O$_2$ partial pressure/Ar partial pressure | Energy gap Eg (eV) | Ionization potential energy I (eV) | Electron affinity $\chi$ (eV) |
|---|---|---|---|---|---|---|
| Sample 6 | 0.75 | 0.5 | 0 | 3.94 | 6.93 | 2.99 |
| Sample 7 | 0.75 | 0.5 | 0.01 | 3.98 | 7.14 | 3.16 |
| Sample 8 | 0.25 | 0.5 | 0 | 3.59 | 7.05 | 3.46 |
| Sample 9 | 0.25 | 0.5 | 0.01 | 3.55 | 7.19 | 3.64 |

FIG. 9 shows Tauc plots of the results of the measurements of reflectance and transmittance of each of samples 6 to 9. The Tauc plots shown at "A" in FIG. 9 show the results of Samples 6 and 7 having the value of Ga/(In+Ga) of 0.75, and the Tauc Therefore, it is clear that, with respect to the oxide semiconductor layer made of InGaZnO, the electron affinity X$_1$ at the area A$_1$ larger than the electron affinity X$_3$ at the area A$_3$ can be provided, for example, by providing the same composition ratio of InGaZnO at the areas $A_1$ to $A_3$, and forming the area $A_1$ at a larger value of oxygen partial pressure/argon partial pressure during film formation than that for forming the area $A_3$.

Similarly, the area $A_2$ is formed at a smaller value of oxygen partial pressure/argon partial pressure during film formation than that for forming the area $A_1$. Thus, the well-type potential structure can be formed only by changing the value of oxygen partial pressure/argon partial pressure during film formation.

In general, when the value of oxygen partial pressure/argon partial pressure during film formation is large, a high oxygen concentration is provided in the film. In contrast, when the value of oxygen partial pressure/argon partial pressure during film formation is small, a low oxygen concentration is provided in the film. Therefore, the above results indicate that the electron affinity increases as the oxygen concentration in the film increases.

In this experiment, the approach of increasing the value of oxygen partial pressure/argon partial pressure during film formation was employed to increase the oxygen concentration in the film. Besides this approach, the oxygen concentration in the film can also be increased by applying oxygen radicals to the surface where the film is formed, or by applying ultraviolet light to the surface where the film is formed in an ozone atmosphere.

The modulation of the value of Ga/(In+Ga) and the modulation of the oxygen concentration in the film may be applied simultaneously. For example, a well-type barrier structure (electron affinity difference $\Delta X=0.65$) which is deeper than one formed only with the modulation of the composition ratio or the modulation of the oxygen concentration can be provided by forming a structure which includes the first area $A_1$ made of an IGZO film having a composition ratio of Ga/(In+Ga)=0.75 and a high oxygen concentration in the film (oxygen partial pressure/argon partial pressure during film formation=0.01) (Sample 9 in Table 3), and the second area $A_2$ and the third area $A_3$ made of IGZO films having a composition ratio of Ga/(In+Ga) around 0.25 and a low oxygen concentration in the film (oxygen partial pressure/argon partial pressure during film formation=0) (Sample 6 in Table 3), which sandwich the first area.

Now, an experiment carried out for studying the carrier concentration and the mobility with respect to the IGZO film is described. The carrier concentration and the mobility can be found by measuring the hole effect and the specific resistance.

Figure 14:
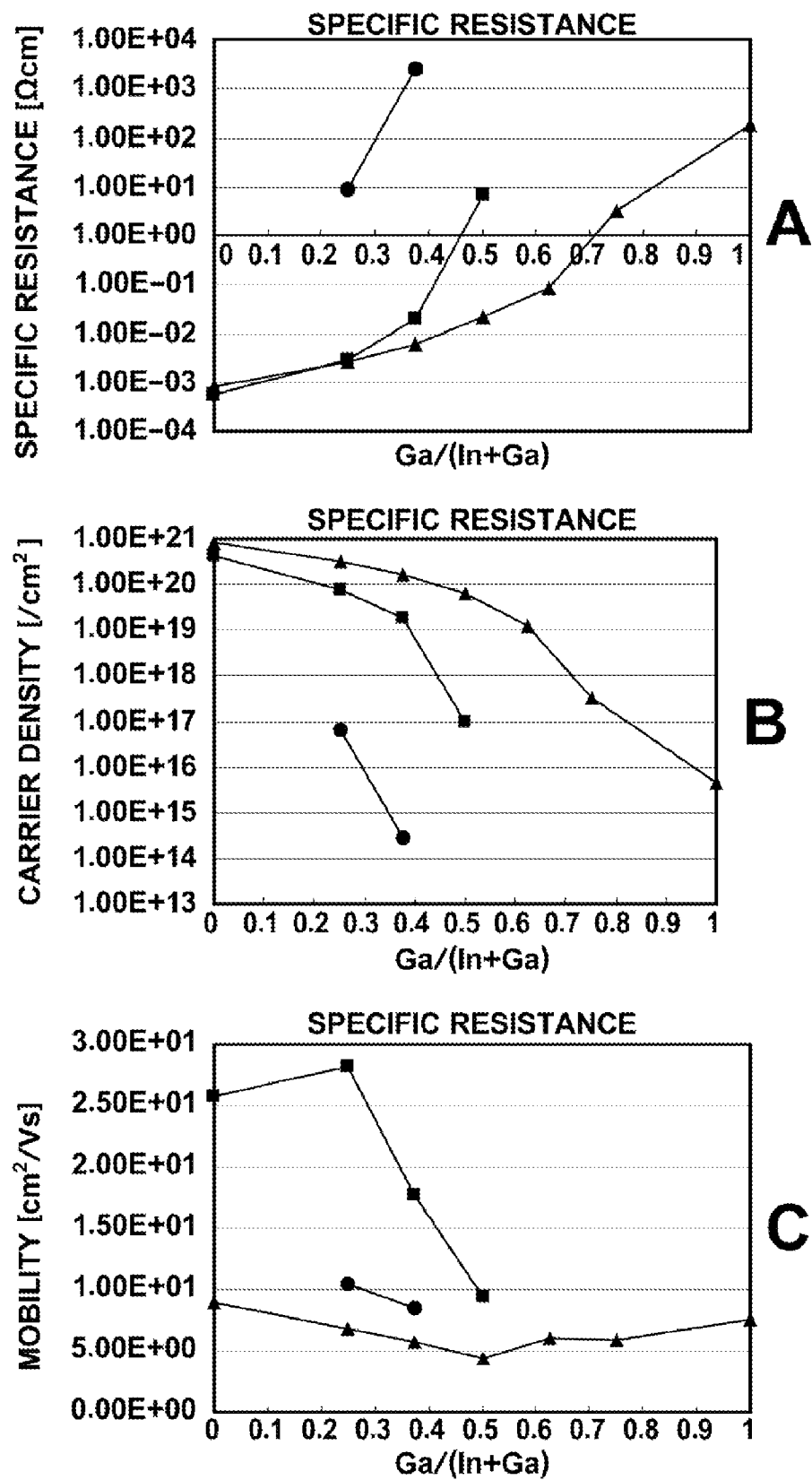
FIG. 14 shows dependency of specific resistance (at A), carrier density (at B) and mobility (at C) on a value of Ga/(In+Ga)

FIG. 14 shows, at "A" to "C", dependencies of the specific resistance, the carrier density and the mobility on the value of Ga/(In+Ga) in IGZO films which were produced with varying the value of oxygen partial pressure/argon partial pressure. In FIG. 14, the black circles are data of a sample which was formed with the value of oxygen partial pressure/argon partial pressure of 0.01, the black squares are data of a sample which was formed with the value of oxygen partial pressure/argon partial pressure of 0.005, and the black triangles are data of a sample which was formed with the value of oxygen partial pressure/argon partial pressure of 0.

The samples used in the measurements were produced in the same manner as described above. The measurements of the hole effect and the specific resistance were achieved using a hole measurement system (a hole effect/specific resistance measurement system, Resi Test 8300, available from TOYO Corporation).

As can be seen from the data shown at "B" in FIG. 14, the carrier density can independently be controlled by changing the value of Ga/(In+Ga) or the value of oxygen partial pressure/argon partial pressure. For example, only the carrier concentration in the film can arbitrarily be controlled without changing the bandgap of the film by keeping the value of Ga/(In+Ga) constant and changing only the value of oxygen partial pressure/argon partial pressure. When the value of oxygen partial pressure/argon partial pressure is 0, however, although the carrier concentration can arbitrarily be controlled by changing only the value of Ga/(In+Ga), the mobility is low, as can be seen from the data shown at "C" in FIG. 14. Thus, it has been found from theses results that desired improvement of the mobility cannot be achieved only by increasing the oxygen deficiency and increasing the carrier concentration.

Next, results of comparison of the specific resistance, the carrier concentration and the mobility between a single layer IGZO film and a multilayer IGZO film is described.

As the multilayer IGZO film, the IGZO film of Sample 9 shown in Table 3, which had a composition ratio of 0.25 and a value of oxygen partial pressure/argon partial pressure of 0.01, the IGZO film of Sample 7, which had a composition ratio of 0.75 and a value of oxygen partial pressure/argon partial pressure of 0.01, and the IGZO film of Sample 6, which had a composition ratio of 0.75 and a value of oxygen partial pressure/argon partial pressure of 0, were used to produce a structure where a 10 nm-thick IGZO film of Sample 9 was sandwiched between a 10 nm-thick IGZO film of Sample 7 and a 50 nm-thick IGZO film of Sample 6.

As the single layer IGZO film, the film of Sample 9 (IGZO-0.25-0.01), the film of Sample 7 (IGZO-0.75-0.01) and the film of Sample 6 (IGZO-0.75-0) were prepared.

Measurement and evaluation of holes were carried out with respect to the multilayer IGZO film and the single IGZO films. FIG. 15 shows, at "A" to "C", the specific resistance, the carrier concentration and the mobility found from the measurement of holes, where the left column of each diagram contains the results of the single IGZO film samples and the right column contains results of the multilayer IGZO film sample. It should be noted that the measurement of Sample 7 (IGZO-0.75-0.01) was impossible (the sheet resistance exceeded $1 \times 10^9 \Omega/\square$).

The multilayer IGZO film exhibited an increased carrier density, a decreased specific resistance and an increased mobility compared to the results of the single IGZO films corresponding to the individual areas of the oxide semiconductor layer. This indicates that the well-type potential was formed and electrons moved into the well layer.

Although the experiment here was carried out with respect to the IGZO films, it is believed that the similar effect is provided by forming the well-type potential with other material systems.

The use of the above-described thin-film transistor of the invention is not particularly limited; however, the thin-film transistor of the invention is suitable for use, for example, as a driving element in electro-optic devices, such as display devices (for example, liquid crystal display devices, organic EL (Electro Luminescence) display devices, inorganic EL display devices, etc.)

Further, the electronic device of the invention may be applicable to a driving element (drive circuit) in various electron devices, such as a flexible display using a resin substrate, which can be produced by a low temperature process, image sensors, such as a CCD (Charge Coupled Device) and a CMOS (Complementary Metal Oxide Semiconductor), various sensors, such as an X-ray sensor, MEMS (Micro Electro Mechanical System), etc.

Display devices and sensors of the invention employing the thin-film transistor of the invention exhibit good characteristics with low power consumption. The "characteristics" here refers to display characteristics for a display device, and sensitivity characteristics for a sensor.

Liquid Crystal Display Device

Figure 17:
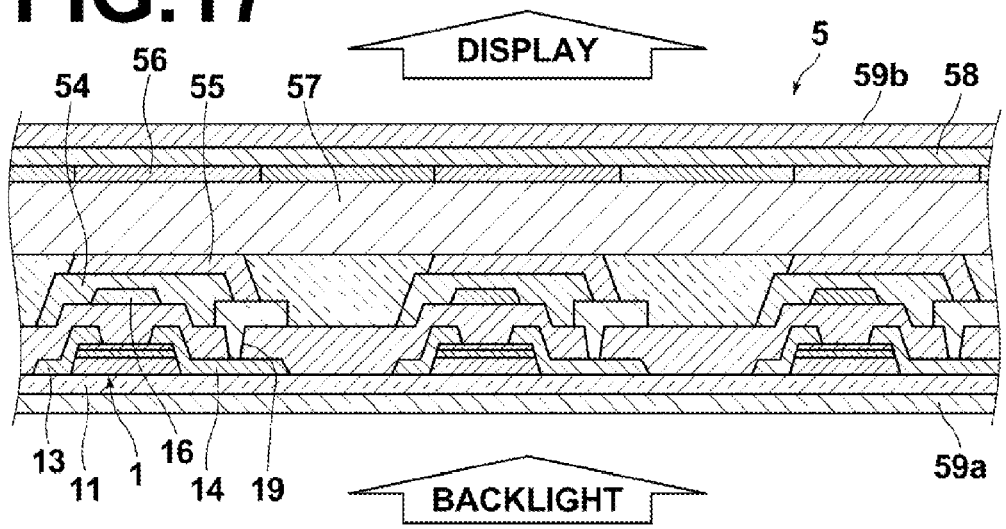
FIG. 17 is a schematic sectional view illustrating a part of a liquid crystal display device according to an embodiment of the invention.
Figure 18:
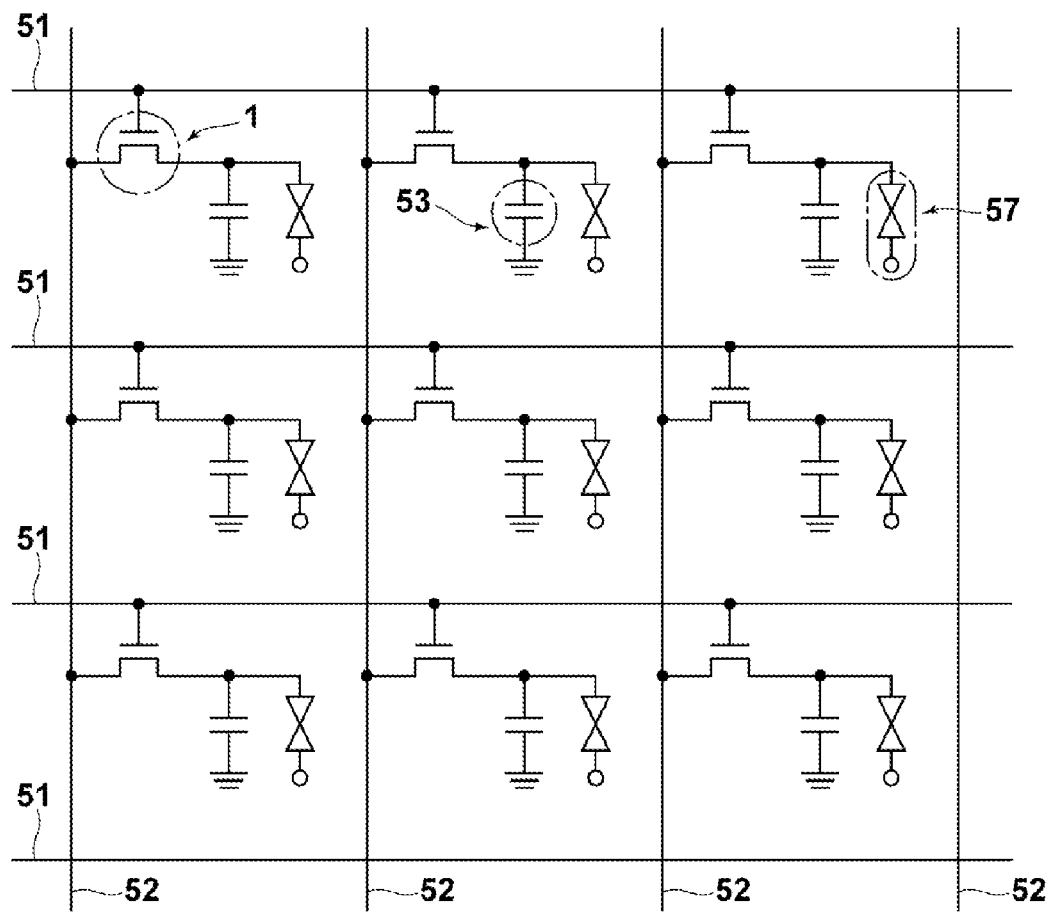
FIG. 18 is a schematic configuration diagram of electric wiring of the liquid crystal display device shown in FIG. 17.

FIG. 17 is a schematic sectional view showing a part of a liquid crystal display device, which is one embodiment of the electro-optic device of the invention, and FIG. 18 is a schematic configuration diagram of electric wiring thereof.

As shown in FIG. 17, a liquid crystal display device 5 of this embodiment includes: the top-gate thin-film transistor 1 shown at "A" in FIG. 3; a lower pixel electrode 55 formed above the gate electrode 16 of the transistor 1 protected by a passivation layer 54, an opposite upper electrode 56, and a liquid crystal layer 57 sandwiched between the lower pixel electrode 55 and the upper electrode 56; an RGB color filter 58 for displaying different colors corresponding to pixels; and polarizing plates 59a and 59b provided on the substrate 11 and on the color filter 58 of a TFT 1, respectively.

Further, as shown in FIG. 18, the liquid crystal display device of this embodiment includes pieces of gate wiring 51 which are parallel to each other, and pieces of data wiring 52 which are parallel to each other and intersect with the pieces of gate wiring 51. The gate wiring 51 and the data wiring 52 are electrically insulated from each other. The thin-film transistor 1 is provided in the vicinity of each intersection between the gate wiring 51 and the data wiring 52.

The gate electrode 16 of the thin-film transistor 1 is connected to the gate wiring 51, and the source electrode 13 of the thin-film transistor 1 is connected to the data wiring 52. The drain electrode 14 of the thin-film transistor 1 is connected to the lower pixel electrode 55 via a contact hole 19 formed in the gate insulating film 15 (a conductor is embedded in the contact hole 19). The lower pixel electrode 55 and the opposite electrode 56, which is grounded, form a capacitor 53.

Although the liquid crystal device of this embodiment shown in FIG. 17 includes the top-gate thin-film transistor, the thin-film transistor used in the liquid crystal device, which is the display device of the invention, is not limited to the top-gate thin-film transistor. The thin-film transistor used in the liquid crystal device may be a bottom-gate thin-film transistor.

Since the thin-film transistor of the invention has high mobility, the liquid crystal display device can perform high-quality display with high definition, high speed response, high contrast, etc., and is also suitable to provide a large-screen display. In a case where the active layer is made of amorphous IGZO, variation of device characteristics can be suppressed, thereby achieving excellent visual quality of a large-screen display without unevenness.

Further, since characteristics shift is small, reduction of gate voltage, and, in turn, reduction of power consumption of the display device can be achieved. Moreover, according to the invention, the thin-film transistor can be produced with using, as the semiconductor layer, an amorphous IGZO film, which can be formed by a low temperature process (for example, 200° C. or less), and therefore a resin substrate (a plastic substrate) may be used as the substrate. Thus, according to the invention, a flexible liquid crystal display device with excellent visual quality can be provided.

Organic EL Display Device

Figure 19:
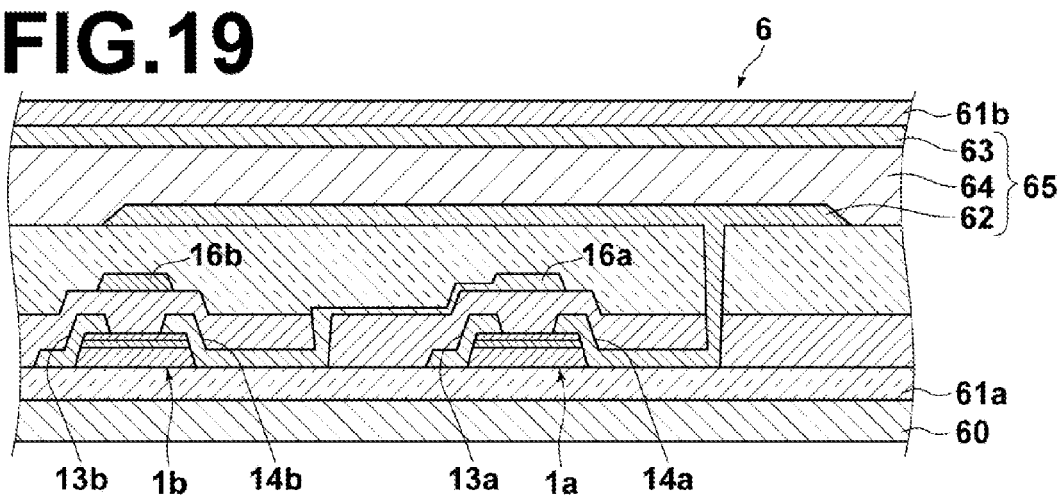
FIG. 19 is a schematic sectional view illustrating a part of an organic EL display device according to an embodiment of the invention.
Figure 20:
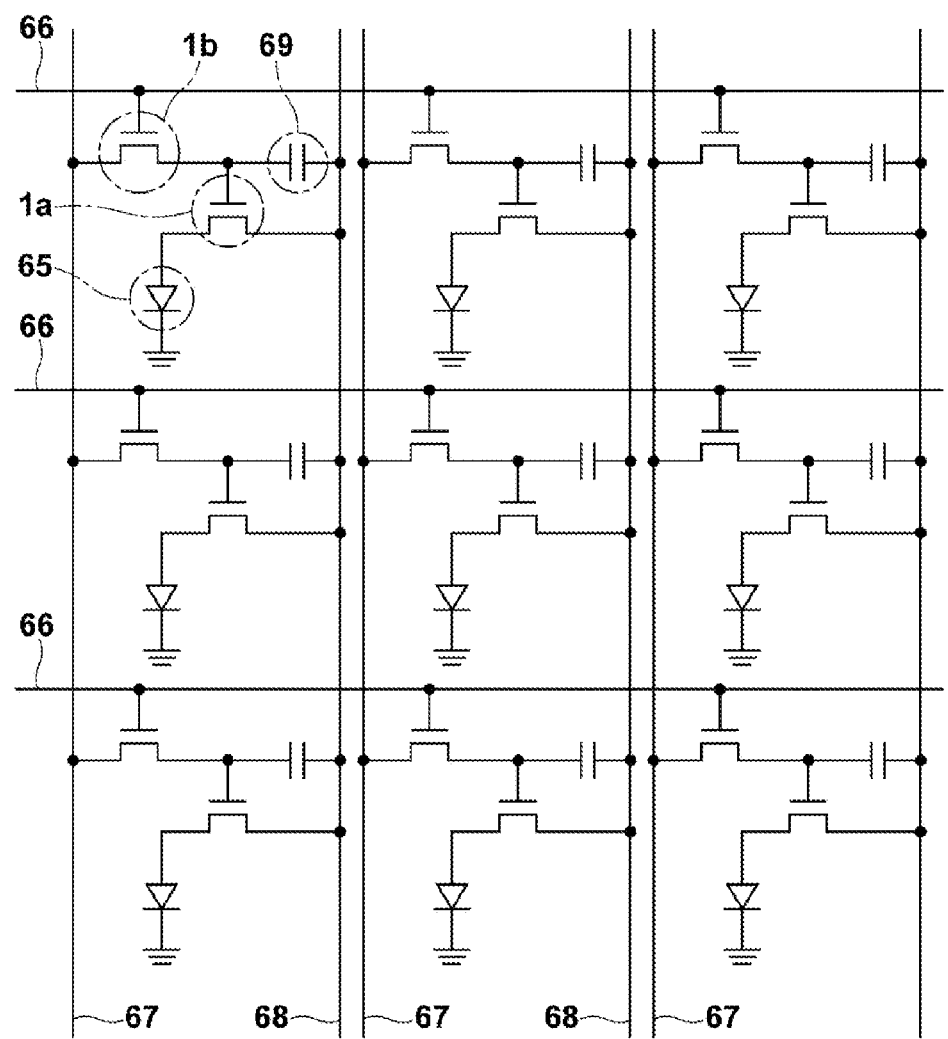
FIG. 20 is a schematic configuration diagram of electric wiring of the organic EL display device shown in FIG. 19.

FIG. 19 is a schematic sectional view showing a part of an active matrix organic EL display device, which is one embodiment of the electro-optic device of the invention, and FIG. 20 is a schematic configuration diagram of electric wiring thereof.

There are two types of driving system of organic EL display devices: a simple matrix system and an active matrix system. The simple matrix system is advantageous in that it can be produced at low costs. However, since light emission from the pixels is carried out with selecting the scan lines one by one, the number of scan lines is inversely proportional to a light emission time per scan line. Therefore, it is difficult to achieve a high-definition, large-screen display device of the simple matrix system. The active matrix system includes transistors and capacitors which are formed correspondingly to the individual pixels, and therefore results in high production costs. However, the active matrix system has no difficulty in increasing the number of scan lines, which is the case with the simple matrix system, and therefore is suitable for providing a high-definition, large-screen display device.

An active-matrix organic EL display device 6 of this embodiment includes: the top-gate thin-film transistors 1 shown at "A" in FIG. 3, which are provided as a driving transistor 1a and a switching transistor 1b on a substrate 60 provided with a passivation layer 61a; an organic light emitting device 65 formed above the transistors 1a and 1b and including an organic light emitting layer 64 sandwiched between a lower electrode 62 and an upper electrode 63; and a passivation layer 61b protecting the upper surface of the active-matrix organic EL display device 6.

Further, as shown in FIG. 20, the organic EL display device 7 of this embodiment includes pieces of gate wiring 66 which are parallel to each other, and pieces of data wiring 67 and pieces of drive wiring 68 which are parallel to each other and intersect with the pieces of gate wiring 66. The gate wiring 66 is electrically insulated from the data wiring 67 and the drive wiring 68. A gate electrode 16a of the switching thin-film transistor 1b is connected to the gate wiring 66, and a source electrode 13b of the switching thin-film transistor 1b is connected to the data wiring 67. A drain electrode 14b of the switching thin-film transistor 1b is connected to the gate electrode 16a of the driving thin-film transistor 1a, and keeps the driving thin-film transistor 1a in an "ON" state with using a capacitor 69. A source electrode 13a of the driving thin-film transistor 1a is connected to the drive wiring 68, and a drain electrode 14a is connected to the organic EL light emitting device 65.

Although the organic EL device of this embodiment shown in FIG. 19 includes the top-gate thin-film transistors 1a and 1b, the thin-film transistors used in the organic EL device, which is the display device of the invention, are not limited to the top-gate thin-film transistors. The thin-film transistors used in the organic EL device may be bottom-gate thin-film transistors.

Since the thin-film transistor of the invention has high mobility, high-quality display with low power consumption can be achieved. Further, according to the invention, the thin-film transistors can be produced with using, as the semiconductor layer, an amorphous IGZO film, which can be formed by a low temperature process (for example, 200° C. or less), and therefore a resin substrate (a plastic substrate) may be used as the substrate. Thus, according to the invention, a flexible organic EL display device with excellent visual quality can be provided.

It should be noted that the organic EL display device shown in FIG. 19 may be a top-emission type device with the upper electrode 63 being a transparent electrode, or a bottom-emission type device with the lower electrode 62 and each electrode of the TFT being transparent electrodes.

X-Ray Sensor

Figure 21:
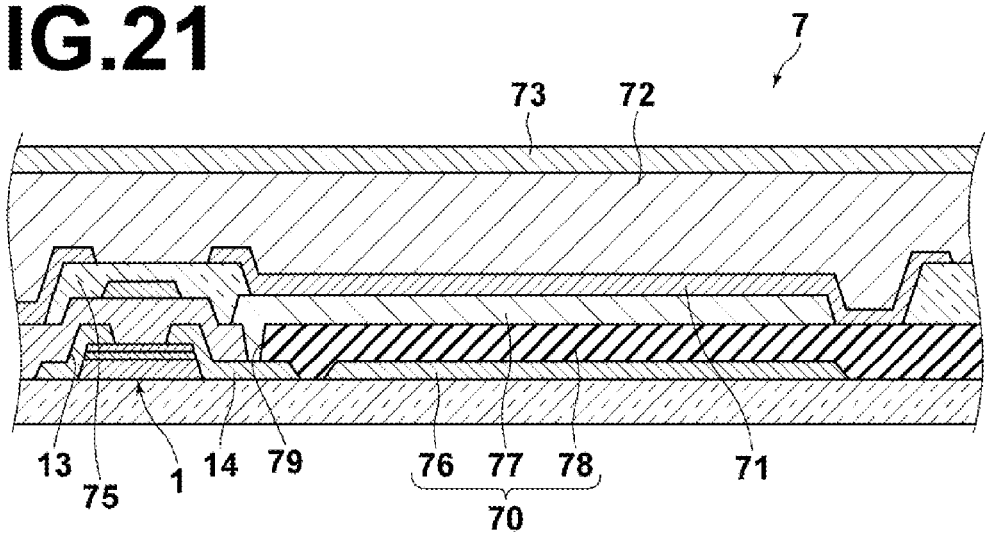
FIG. 21 is a schematic sectional view illustrating a part of an X-ray sensor array according to an embodiment of the invention.
Figure 22:
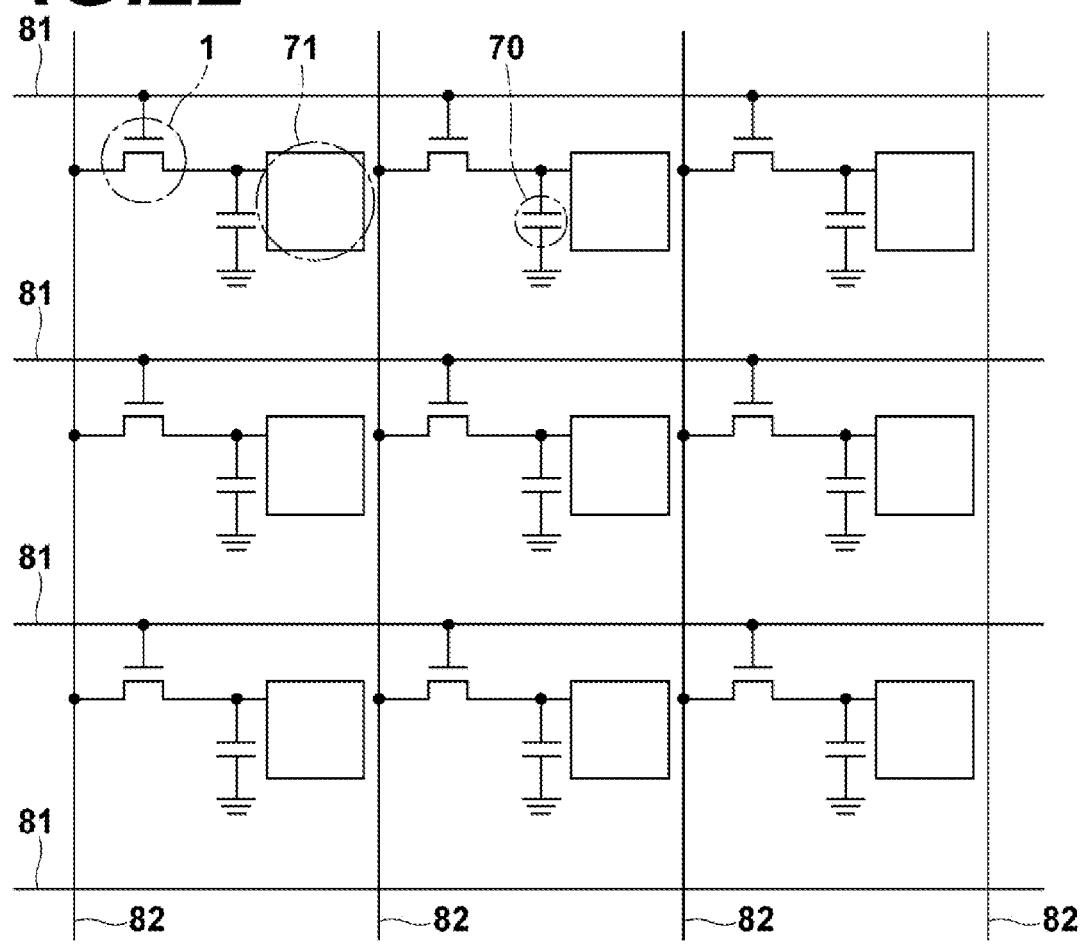
FIG. 22 is a schematic configuration diagram of electric wiring of the X-ray sensor array shown in FIG. 21.

FIG. 21 is a schematic sectional view showing a part of an X-ray sensor, which is one embodiment of the sensor of the invention, and FIG. 22 is a schematic configuration diagram of electric wiring thereof.

More specifically, FIG. 21 is an enlarged schematic sectional view of a part of the X-ray sensor array. An X-ray sensor 7 of this embodiment includes: the thin-film transistor 1 and a capacitor 70 formed on a substrate; a charge collection electrode 71 formed on the capacitor 70; an X-ray conversion layer 72; and an upper electrode 73. A passivation film 75 is provided on the thin-film transistor 1.

The capacitor 70 has a structure where an insulating film 78 is sandwiched between a lower capacitor electrode 76 and an upper capacitor electrode 77. The upper capacitor electrode 77 is connected to one of the source electrode 13 and the drain electrode 14 of the thin-film transistor 1 (in FIG. 21, the upper capacitor electrode 77 is connected to the drain electrode 14) via a contact hole 79 provided in the insulating film 78.

The charge collection electrode 71 is provided on the upper capacitor electrode 77 of the capacitor 70 and is in contact with the upper capacitor electrode 77.

The X-ray conversion layer 72 is made of amorphous selenium, and is disposed to cover the thin-film transistor 1 and the capacitor 70.

The upper electrode 73 is provided on the X-ray conversion layer 72 and is in contact with the X-ray conversion layer 72.

As shown in FIG. 22, the X-ray sensor 7 of this embodiment includes pieces of gate wiring 81 which are parallel to each other, and pieces of data wiring 82 which are parallel to each other and intersect with the pieces of gate wiring 81. The gate wiring 81 and the data wiring 82 are electrically insulated from each other. The thin-film transistor 1 is provided in the vicinity of each intersection between the gate wiring 81 and the data wiring 82.

The gate electrode 16 of the thin-film transistor 1 is connected to the gate wiring 81, and the source electrode 13 of the thin-film transistor 1 is connected to the data wiring 82. The drain electrode 14 of the thin-film transistor 1 is connected to the charge collection electrode 71. The charge collection electrode 71 and the opposite electrode 76, which is grounded, form the capacitor 70.

To the X-ray sensor 7 having this structure, X-ray is applied from the upper side as shown in FIG. 21 (the upper electrode 73 side) and electron-hole pairs are formed in the X-ray conversion layer 72. While a high electric field is applied to the X-ray conversion layer 72 from the upper electrode 73, the generated electric charge is stored in the capacitor 70 and read out by sequential scanning of the thin-film transistors 1.

The X-ray sensor of the invention is provided with the thin-film transistor 1, which has a high "ON" current and good reliability, and thus has high S/N and good sensitivity characteristics. When the X-ray sensor of the invention is applied to an X-ray digital imaging device, images with wide dynamic range are provided. In particular, the X-ray digital imaging device of the invention is suitable to be applied to an X-ray digital imaging device that can photograph not only still images but also see-through moving images. Further, if the thin-film transistor includes the active layer made of amorphous IGZO, images with excellent uniformity can be provided.

Although the X-ray sensor of this embodiment shown in FIG. 21 includes the top-gate thin-film transistor, the thin-film transistor used in the sensor of the invention is not limited to the top-gate thin-film transistor. The thin-film transistor used in the sensor of the invention may be a bottom-gate thin-film transistor.

EXAMPLES

Top-gate thin-film transistors of Example 1 and Comparative Examples 1 to 4 were produced to compare the mobility thereof. Table 4 shows the value of Ga/(In+Ga), the value of oxygen partial pressure/argon partial pressure during film formation and the mobility of each transistor.

TABLE 4

| | Third area Ga/(In + Ga) $O_2$ partial pressure/ Ar partial pressure | First area Ga/(In + Ga) $O_2$ partial pressure/ Ar partial pressure | Second area Ga/(In + Ga) $O_2$ partial pressure/ Ar partial pressure | Mobility μ [cm²/Vs] |
|---|---|---|---|---|
| Example 1 | 0.75 0.05 | 0.25 0.05 | 0.75 0.005 | 65 |
| Comparative Example 1 | 0.75 0.005 | 0.25 0.005 | 0.75 0.005 | — |
| Comparative Example 2 | 0.75 0.05 | 0.25 0.05 | 0.75 0.05 | — |
| Comparative Example 3 | 0.75 0.05 | 0.75 0.05 | 0.75 0.005 | — |
| Comparative Example 4 | 0.25 0.05 | 0.25 0.05 | 0.25 0.005 | — |

Example 1

A top-gate top-contact thin-film transistor having the structure shown at "A" in FIG. 3 was produced as Example 1.

As the substrate 11, a synthetic quartz glass substrate (T-4040, available from Covalent Materials Corporation) was used. The oxide semiconductor layer 12 was made of InGaZnO, which was formed by the following process. First, a 100 nm-thick InGaZnO film, in which Ga/(In+Ga)=0.75 and Zn/(In+Ga)=0.5, was formed through sputtering as the third area $A_3$. Then, a 10 nm-thick IGZO film, in which Ga/(In+Ga)=0.25 and Zn/(In+Ga)=0.5, was formed through sputtering as the first area $A_1$. Further, a 10 nm-thick IGZO film, in which Ga/(In+Ga)=0.75 and Zn/(In+Ga)=0.5, was formed through sputtering as the second area $A_2$. The film formation of the oxide semiconductor layer 12 was continuously carried out without exposing the areas to the atmosphere. The sputtering of each area was achieved through co-sputtering using an $In_2O_3$ target, a $Ga_2O_3$ target and a ZnO target. Control of the film thickness of each area was achieved by controlling the film formation time. Detailed sputtering conditions for the respective areas were as follows:
  sputtering conditions used to form the third area $A_3$
    achieved vacuum degree: $6 \times 10^{-6}$ Pa
    film formation pressure: $4.4 \times 10^{-1}$ Pa
    film formation temperature: room temperature
    oxygen partial pressure/argon partial pressure: 0.005
    ratio of electric powers applied to the $In_2O_3$ target, the $Ga_2O_3$ target and the ZnO target: 15.5:67.1:17.4
  sputtering conditions used to form the first area $A_1$
    achieved vacuum degree: $6 \times 10^{-6}$ Pa
    film formation pressure: $4.4 \times 10^{-1}$ Pa
    film formation temperature: room temperature
    oxygen partial pressure/argon partial pressure: 0.05
    ratio of electric powers applied to the $In_2O_3$ target, the $Ga_2O_3$ target and the ZnO target: 43.0:38.0:19.0
  sputtering conditions used to form the second area $A_2$
    achieved vacuum degree: $6 \times 10^{-6}$ Pa
    film formation pressure: $4.4 \times 10^{-1}$ Pa
    film formation temperature: room temperature
    oxygen partial pressure/argon partial pressure: 0.05
    ratio of electric powers applied to the $In_2O_3$ target, the $Ga_2O_3$ target and the ZnO target: 14.7:67.8:17.5

After the areas of the oxide semiconductor layer 12 were formed through sputtering, the oxide semiconductor layer 12 was patterned through photolithography and wet etching using a dilute sulfuric acid. The source electrode 13 and the drain electrode 14 were formed by forming a 10 nm-thick Ti film through sputtering, forming a 100 nm-thick Au film through sputtering, and then patterning the films through a liftoff process. The gate insulating film 15 was formed by forming a 100 nm-thick $Al_2O_3$ film through sputtering. The gate electrode 16 was formed by forming a 10 nm-thick Ti film through sputtering, forming a 100 nm-thick Au film through sputtering, and then patterning the films through a liftoff process.

Through the above-described process, the top-gate thin-film transistor 1 of Example 1 having a channel length of 10 µm and a channel width of 10 µm was provided. That is, the thin-film transistor of Example 1 included the oxide semiconductor layer which had a well-type potential provided by modulating the values of Ga/In+Ga and the oxygen concentrations at the first area and the third area to provide a difference between the electron affinities thereof, and modulating only the values of Ga/In+Ga at the first area and the second area to provide a difference between the electron affinities thereof.

Comparative Example 1

A thin-film transistor of Comparative Example 1 was produced in the same manner as in Example 1, except that the values of oxygen partial pressure/argon partial pressures for forming the first and second areas, respectively, were changed to 0.005. In Comparative Example 1, the same value of oxygen partial pressure/argon partial pressure and the uniform oxygen concentration were used to form the first to third areas.

Comparative Example 2

A thin-film transistor of Comparative Example 2 was produced in the same manner as in Example 1, except that the value of oxygen partial pressure/argon partial pressure for forming the third area was changed to 0.05. In Comparative Example 2, the same value of oxygen partial pressure/argon partial pressure and the uniform oxygen concentration were used to form the first to third areas. This oxygen concentration was higher than that used in Comparative Example 1.

Comparative Example 3

A thin-film transistor of Comparative Example 3 was produced in the same manner as in Example 1, except that the composition ratio of the IGZO film at the first area of the oxide semiconductor layer was changed to Ga/(In+Ga)=0.75 and Zn/(In+Ga)=0.5. In Comparative Example 3, the first area, the second area and the third area of the oxide semiconductor layer had the same value of Ga/(In+Ga), and the first area and the second area had the same oxygen concentration and thus had the same electron affinity. Therefore, no well structure in the film-thickness direction was formed.

Comparative Example 4

A thin-film transistor of Comparative Example 4 was produced in the same manner as in Example 1, except that the composition ratios of the IGZO films at the second and third areas, respectively, were changed to Ga/(In+Ga)=0.25 and Zn/(In+Ga)=0.5. In Comparative Example 4, the first area, the second area and the third area of the oxide semiconductor layer had the same value of Ga/(In+Ga), which was different from that in Comparative Example 3, and the first area and the second area had the same oxygen concentration and thus had the same electron affinity. Therefore, no well structure in the film-thickness direction was formed.

With respect to the thin-film transistors of Example 1 and Comparative Examples 1 to 4 described above, measurements of transistor characteristics (Vg-Id characteristics) and mobility i were carried out using a semiconductor parameter analyzer 4156C (available from Agilent Technologies).

The measurement of the Vg-Id characteristics was achieved by using a fixed drain voltage (Vd) of 5V and varying a gate voltage (Vg) within the range from −5V to +10V to measure a drain current (Id) at each gate voltage (Vg).

As shown in Table 4, the thin-film transistor of Example 1 achieved a mobility of around 65 $cm^2$/Vs. In contrast, the thin-film transistors of Comparative Examples 1 and 4 always provided a high current value regardless of the gate voltage Vg, and did not work as a transistor. The thin-film transistors of Comparative Examples 2 and 3 always provided a low current value regardless of the gate voltage Vg, and did not work as a transistor.

What is claimed is:

1. A thin-film transistor comprising an oxide semiconductor layer, a source electrode, a drain electrode, a gate insulating film and a gate electrode formed on a substrate,
    wherein the oxide semiconductor layer comprises a first area, a second area and a third area forming a well-type potential in a film-thickness direction, the first area forming a well of the well-type potential and having a first electron affinity, the second area being disposed nearer to the gate electrode than the first area and having a second electron affinity smaller than the first electron affinity, and the third area being disposed farther from the gate electrode than the first area and having a third electron affinity smaller than the first electron affinity,
    wherein the oxide semiconductor layer is amorphous, and
    wherein an oxygen deficiency of the third area is greater than an oxygen deficiency of the first area.

2. The thin-film transistor as claimed in claim 1, wherein an oxygen concentration at the second area is lower than the oxygen concentration at the first area.

3. The thin-film transistor as claimed in claim 1, wherein the first area and the second area have different cationic composition ratios, and the first area and the third area have different cationic composition ratios.

4. A thin-film transistor comprising an oxide semiconductor layer, a source electrode, a drain electrode, a gate insulating film and a gate electrode formed on a substrate,
    wherein the oxide semiconductor layer comprises a first area, a second area and a third area forming a well-type potential in a film-thickness direction, the first area forming a well of the well-type potential and having a first electron affinity, the second area being disposed nearer to the gate electrode than the first area and having a second electron affinity smaller than the first electron affinity, and the third area being disposed farther from the gate electrode than the first area and having a third electron affinity smaller than the first electron affinity, and
    wherein at least an oxygen concentration at the third area is lower than an oxygen concentration at the first area, and wherein the second area and the third area have bandgaps larger than a bandgap at the first area.

5. The thin-film transistor as claimed in claim 1, wherein each area of the oxide semiconductor layer comprises at least one element selected from the group consisting of Al, Sc, Ti, Mn, Fe, Ga, Y, In, Sn, Ho, Er, Tm, Yb and Lu, and at least one element selected from the group consisting of Mg, Ca, Ni, Zn, Sr and Ba.

6. The thin-film transistor as claimed in claim 1, wherein each area of the oxide semiconductor layer comprises at least one of In and Ga.

7. The thin-film transistor as claimed in claim 1, wherein each area of the oxide semiconductor layer comprises $a(In_2O_3) \cdot b(Ga_2O_3) \cdot c(ZnO)$, where $a \geq 0$, $b \geq 0$, $c \geq 0$, $a+b \neq 0$, $b+c \neq 0$ and $c+a \neq 0$.

8. A thin-film transistor comprising an oxide semiconductor layer, a source electrode, a drain electrode, a gate insulating film and a gate electrode formed on a substrate,
wherein the oxide semiconductor layer comprises a first area, a second area and a third area forming a well-type potential in a film-thickness direction, the first area forming a well of the well-type potential and having a first electron affinity, the second area being disposed nearer to the gate electrode than the first area and having a second electron affinity smaller than the first electron affinity, and the third area being disposed farther from the gate electrode than the first area and having a third electron affinity smaller than the first electron affinity, and
wherein at least an oxygen concentration at the third area is lower than an oxygen concentration at the first area, and
wherein each area of the oxide semiconductor layer comprises $a(In_2O_3) \cdot b(Ga_2O_3) \cdot c(ZnO)$, where $a \geq 0$, $b \geq 0$, $c \geq 0$, $a+b \neq 0$, $b+c \neq 0$ and $c+a$ 0, and
wherein a value of $b/(a+b)$ at the first area of the oxide semiconductor layer is smaller than values of $b/(a+b)$ at the second area and the third area.

9. The thin-film transistor as claimed in claim 8, wherein the value of $b/(a+b)$ at the first area of the oxide semiconductor layer is not more than 0.95.

10. The thin-film transistor as claimed in claim 9, wherein the values of $b/(a+b)$ at the second area and the third area are not less than 0 5.

11. The thin-film transistor as claimed in claim 10, wherein the value of $b/(a+b)$ at the first area of the oxide semiconductor layer is 0.25, and the values of $b/(a+b)$ at the second area and the third area are 0.75.

12. The thin-film transistor as claimed in claim 1, wherein the substrate is flexible.

13. The thin-film transistor as claimed in claim 12, wherein the substrate comprises
any one of the group of resin materials consisting of saturated polyester resin, polyethylene terephthalate resin, polyethylene naphthalate resin, cross-linked diester fumarate resin, polycarbonate resin, polyether sulfone resin, polysulfone resin, polyallylate resin, cyclic polyolefin resin, cellulose resin, polyimide resin, polyamideimide resin, maleimide-olefin resin, polyamide resin, acrylic resin, fluorine resin, epoxy resin, silicone resin film, polybenzoxazole resin, episulfide compound, liquid crystal polymer, cyanate resin and aromatic ether resin,
any one of the group of plastic materials consisting of a composite plastic material containing silicon oxide particles, a composite plastic material containing nanoparticles, such as metal nanoparticles, inorganic oxide nanoparticles or inorganic nitride nanoparticles, a composite plastic material containing a metal or inorganic nanofiber or a metal or inorganic microfiber, a composite plastic material containing carbon fiber and/or carbon nanotube, a composite plastic material containing glass flake, glass fiber and/or glass beads, composite plastic material containing a clay mineral or particles having a mica-derived crystal structure, and a multilayer plastic material including at least one bonded interface formed between thin glass and any one of the group of resin materials,
a substrate comprising a composite material with barrier performance including at least one bonded interface formed between alternately laminated layers of an inorganic material and any one of the group of resin materials, or
any one of the group of substrates consisting of a stainless steel substrate, a multilayer metal substrate including a stainless steel layer and a layer of a different metal, an aluminum substrate, and an aluminum substrate with an oxide film formed by an oxidation treatment applied to a surface thereof.

14. A method of producing a thin-film transistor that comprises an oxide semiconductor layer, a source electrode, a drain electrode, a gate insulating film and a gate electrode formed on a substrate,
wherein the oxide semiconductor layer comprises a first area, a second area and a third area forming a well-type potential in a film-thickness direction, the first area forming a well of the well-type potential and having a first electron affinity, the second area being disposed nearer to the gate electrode than the first area and having a second electron affinity smaller than the first electron affinity, and the third area being disposed farther from the gate electrode than the first area and having a third electron affinity smaller than the first electron affinity,
wherein the oxide semiconductor layer is amorphous, and
wherein an oxygen deficiency of the third area is greater than an oxygen deficiency of the first area,
the method comprising:
a film formation step of forming the oxide semiconductor layer through sputtering, wherein the oxide semiconductor layer comprises a first area, a second area and a third area forming a well-type potential in a film-thickness direction, the first area forming a well of the well-type potential and having a first electron affinity, the second area being disposed nearer to the gate electrode than the first area and having a second electron affinity smaller than the first electron affinity, and the third area being disposed farther from the gate electrode than the first area and having a third electron affinity smaller than the first electron affinity,
wherein the film formation step comprises forming the first area under a first value of oxygen partial pressure/argon partial pressure in a film formation chamber, forming the second area under a second value of oxygen partial pressure/argon partial pressure in the film formation chamber, and forming the third area under a third value of oxygen partial pressure/argon partial pressure in the film formation chamber lower than the first value of oxygen partial pressure/argon partial pressure.

15. The method as claimed in claim 14, wherein the second value of oxygen partial pressure/argon partial pressure is lower than the first value of oxygen partial pressure/argon partial pressure.

16. A method of producing a thin-film transistor that comprises an oxide semiconductor layer, a source electrode, a drain electrode, a gate insulating film and a gate electrode formed on a substrate,
wherein the oxide semiconductor layer comprises a first area, a second area and a third area forming a well-type potential in a film-thickness direction, the first area forming a well of the well-type potential and having a first electron affinity, the second area being disposed nearer to the gate electrode than the first area and having a second electron affinity smaller than the first electron affinity, and the third area being disposed farther from the gate electrode than the first area and having a third electron affinity smaller than the first electron affinity, wherein the oxide semiconductor layer is amorphous, and wherein an oxygen deficiency of the third area is greater than an oxygen deficiency of the first area, the method comprising:

a film formation step of forming the oxide semiconductor layer through sputtering, wherein the oxide semiconductor layer comprises a first area, a second area and a third area forming a well-type potential in a film-thickness direction, the first area forming a well of the well-type potential and having a first electron affinity, the second area being disposed nearer to the gate electrode than the first area and having a second electron affinity smaller than the first electron affinity, and the third area being disposed farther from the gate electrode than the first area and having a third electron affinity smaller than the first electron affinity, wherein the film formation process comprises applying oxygen-containing radicals to a surface on which the first area is formed during and/or after formation of the first area.

17. A method of producing a thin-film transistor that comprises an oxide semiconductor layer, a source electrode, a drain electrode, a gate insulating film and a gate electrode formed on a substrate, wherein the oxide semiconductor layer comprises a first area, a second area and a third area forming a well-type potential in a film-thickness direction, the first area forming a well of the well-type potential and having a first electron affinity, the second area being disposed nearer to the gate electrode than the first area and having a second electron affinity smaller than the first electron affinity, and the third area being disposed farther from the gate electrode than the first area and having a third electron affinity smaller than the first electron affinity, wherein the oxide semiconductor layer is amorphous, and wherein an oxygen deficiency of the third area is greater than an oxygen deficiency of the first area, the method comprising:

a film formation step of forming the oxide semiconductor layer through sputtering, wherein the oxide semiconductor layer comprises a first area, a second area and a third area forming a well-type potential in a film-thickness direction, the first area forming a well of the well-type potential and having a first electron affinity, the second area being disposed nearer to the gate electrode than the first area and having a second electron affinity smaller than the first electron affinity, and the third area being disposed farther from the gate electrode than the first area and having a third electron affinity smaller than the first electron affinity, wherein the film formation process comprises applying ultraviolet light in an ozone atmosphere to a surface on which the first area is formed during and/or after formation of the first area.

18. The method as claimed in claim 14, wherein the substrate is not exposed to atmosphere during the film formation step.

19. The method as claimed in claim 16, wherein the substrate is not exposed to atmosphere during the film formation step.

20. The method as claimed in claim 17, wherein the substrate is not exposed to atmosphere during the film formation step.

21. A display device comprising the thin-film transistor as claimed in claim 1.

22. An image sensor comprising the thin-film transistor as claimed in claim 1.

23. An X-ray sensor comprising the thin-film transistor as claimed in claim 1.

24. An X-ray digital imaging device comprising the X-ray sensor as claimed in claim 23.

25. The X-ray digital imaging device as claimed in claim 24 capable of photographing a moving image.

26. A thin-film transistor comprising an oxide semiconductor layer, a source electrode, a drain electrode, a gate insulating film and a gate electrode formed on a substrate, wherein the oxide semiconductor is an n-type oxide semiconductor, and the oxide semiconductor layer comprises a first area, a second area and a third area forming a well-type potential in a film-thickness direction, the first area forming a well of the well-type potential and having a first electron affinity, the second area being disposed nearer to the gate electrode than the first area and having a second electron affinity smaller than the first electron affinity, and the third area being disposed farther from the gate electrode than the first area and having a third electron affinity smaller than the first electron affinity, wherein the oxide semiconductor layer is amorphous, and wherein at least an oxygen concentration at the third area is lower than an oxygen concentration at the first area.

* * * * *